(12) United States Patent
Park et al.

(10) Patent No.: US 9,245,849 B2
(45) Date of Patent: Jan. 26, 2016

(54) SEMICONDUCTOR DEVICE WITH AIR GAP

(71) Applicant: SK hynix Inc., Gyeonggi-do (KR)

(72) Inventors: Jong-Kook Park, Gyeonggi-do (KR);
Han-Sang Song, Gyeonggi-do (KR);
Jin-Yul Lee, Gyeonggi-do (KR);
Chang-Ki Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/632,781

(22) Filed: Feb. 26, 2015

(65) Prior Publication Data

US 2015/0171014 A1 Jun. 18, 2015

Related U.S. Application Data

(63) Continuation of application No. 14/137,339, filed on Dec. 20, 2013, now Pat. No. 8,999,837.

(30) Foreign Application Priority Data

Aug. 26, 2013 (KR) ........................ 10-2013-0101035

(51) Int. Cl.
| | | |
|---|---|---|
| *H01L 23/48* | (2006.01) | |
| *H01L 23/532* | (2006.01) | |
| *H01L 21/768* | (2006.01) | |
| *H01L 21/764* | (2006.01) | |
| *H01L 23/535* | (2006.01) | |
| *H01L 27/24* | (2006.01) | |

(52) U.S. Cl.
CPC .......... *H01L 23/5329* (2013.01); *H01L 21/764* (2013.01); *H01L 21/76814* (2013.01); *H01L 21/76843* (2013.01); *H01L 21/76877* (2013.01); *H01L 23/535* (2013.01); *H01L 27/2436* (2013.01); *H01L 2924/0002* (2013.01)

(58) Field of Classification Search
CPC ............. H01L 23/5329; H01L 23/535; H01L 21/76814; H01L 21/76877; H01L 21/76843; H01L 21/764; H01L 27/2436
USPC .......................... 257/522, 751, 754, 773, 774
See application file for complete search history.

(56) References Cited

U.S. PATENT DOCUMENTS

| | | | | |
|---|---|---|---|---|
| 6,812,113 B1* | 11/2004 | Alieu | ................. | H01L 21/7682 257/E21.581 |
| 8,513,809 B2* | 8/2013 | Ueda | .................... | H01L 21/764 257/758 |
| 8,999,837 B2* | 4/2015 | Park | ................. | H01L 21/76814 438/619 |
| 2013/0093093 A1* | 4/2013 | Lee | .................. | H01L 27/10855 257/770 |
| 2013/0320550 A1* | 12/2013 | Kim | ................. | H01L 21/76897 257/773 |

* cited by examiner

*Primary Examiner* — Kevin M Picardat
(74) *Attorney, Agent, or Firm* — IP & T Group LLP

(57) ABSTRACT

A method of fabricating a semiconductor device may include forming isolation structures that include openings, over a substrate; forming sacrificial spacers on sidewalls of the openings; forming, on the sacrificial spacers, first conductive patterns that are recessed in the openings; removing the sacrificial spacers, and defining air gaps; forming a liner layer that caps the first conductive patterns and the air gaps; forming second conductive patterns through silicidation of the liner layer; and forming third conductive patterns over the second conductive patterns.

20 Claims, 34 Drawing Sheets

SEMICONDUCTOR DEVICE WITH AIR GAP

CROSS-REFERENCE TO RELATED APPLICATIONS

This application is a continuation of U.S. patent application Ser. No. 14/137,339 filed on Dec. 20, 2013, which claims priority of Korean Patent Application No. 10-2013-0101035, filed on Aug. 26, 2013. The disclosure of each of the foregoing application is incorporated herein by reference in its entirety.

BACKGROUND

1. Field

Exemplary implementations of the present invention relate to a semiconductor device, and more particularly, to a semiconductor device with air gaps and a method of fabricating the same.

2. Description of the Related Art

In general, in a semiconductor device, a dielectric substance is formed between adjacent conductive structures. As a semiconductor device is highly integrated, a distance between conductive structures is gradually decreasing. Due to this fact, parasitic capacitance increases. As parasitic capacitance increases, the performance of the semiconductor device is degraded.

In order to reduce parasitic capacitance, a method of decreasing the dielectric constant of a dielectric substance has been suggested. However, since the dielectric substance has a high dielectric constant, limitations exist in reducing parasitic capacitance.

SUMMARY

Various exemplary implementations are directed to a semiconductor device capable of reducing the parasitic capacitance between adjacent conductive structures, and a method of fabricating the same.

In an exemplary implementation, a method of fabricating a semiconductor device may include: forming isolation structures that include openings, over a substrate; forming sacrificial spacers on sidewalls of the openings; forming, on the sacrificial spacers, recessed first conductive patterns in the openings; removing the sacrificial spacers to define air gaps; forming a liner layer to cap the first conductive patterns and the air gaps forming second conductive patterns through silicidation of the liner layer; and forming third conductive patterns over the second conductive patterns.

In an exemplary implementation, a method of fabricating a semiconductor device may include: forming a plurality of conductive structures that include conductive patterns, over a substrate; forming protective spacers on sidewalls of the conductive structures; forming isolation structures that include openings, between the plurality of conductive structures; forming sacrificial spacers on sidewalls of the openings; forming, on the sacrificial spacers, first conductive patterns that are recessed in the openings; removing the sacrificial spacers to define air gaps; forming a liner layer that caps the first conductive patterns and the air gaps; forming second conductive patterns through silicidation of the liner layer; and forming third conductive patterns over the second conductive patterns.

In an exemplary implementation, a method of fabricating a memory device may include: forming a dielectric layer over a substrate; forming a plurality of bit line structures over the dielectric layer; forming first spacers on sidewalls of the plurality bit line structures; forming isolation structures, which include contact holes, between the plurality bit line structures; forming sacrificial spacers on sidewalls of the contact holes; forming second spacers on sidewalls of the sacrificial spacers; enlarging bottom portions of the contact holes; forming recessed first plugs in the enlarged contact holes; removing the sacrificial spacers to define air gaps; forming an ohmic contact layer that caps the first plugs and the air gaps; and forming second plugs over the ohmic contact layer.

In an exemplary implementation, a semiconductor device may include isolation structures having openings exposing surface portions of a substrate, and conductive structures formed in the openings, the conductive structures comprising recessed first conductive patterns formed in the openings; air gaps defined between sidewalls of the openings and the recessed first conductive patterns; capping patterns to cap the air gaps; second conductive patterns formed over top surfaces of the first conductive patterns and the capping patterns and on upper sidewalls of the openings, the second conductive patterns including a metal silicide; and third conductive patterns formed over the second conductive patterns.

In an exemplary implementation, a semiconductor device may include: a plurality of conductive structures formed over a substrate, the plurality of conductive structures including conductive patterns; protective spacers formed on sidewalls of the plurality of conductive structures; isolation structures formed between the plurality of conductive structures, the isolation structures including a plurality of openings; recessed first conductive patterns formed in the openings; air gaps defined between the conductive patterns and the recessed first conductive patterns; capping patterns to cap the air gaps; second conductive patterns formed over top surfaces of the first conductive patterns, the capping patterns, and on upper sidewalls of the openings, the second conductive patterns including a metal silicide; and third conductive patterns formed over the second conductive patterns.

In an exemplary implementation, a memory device may include: a substrate; gate type transistors buried in the substrate; a plurality of bit line structures, formed over the substrate, to be connected to the buried gate type transistors; isolation structures including a plurality of openings defined between the plurality of bit line structures; silicon plugs formed in the openings; air gaps defined between the silicon plugs and the plurality of bit line structures; capping patterns to cap the air gaps; an ohmic contact layer covering the silicon plugs, the capping patterns, and sidewalls of the plurality of bit line structures, the ohmic contact layer including a metal silicide; metal plugs formed over the ohmic contact layer; and memory elements formed over the metal plugs.

DETAILED DESCRIPTION

Figure 1A:
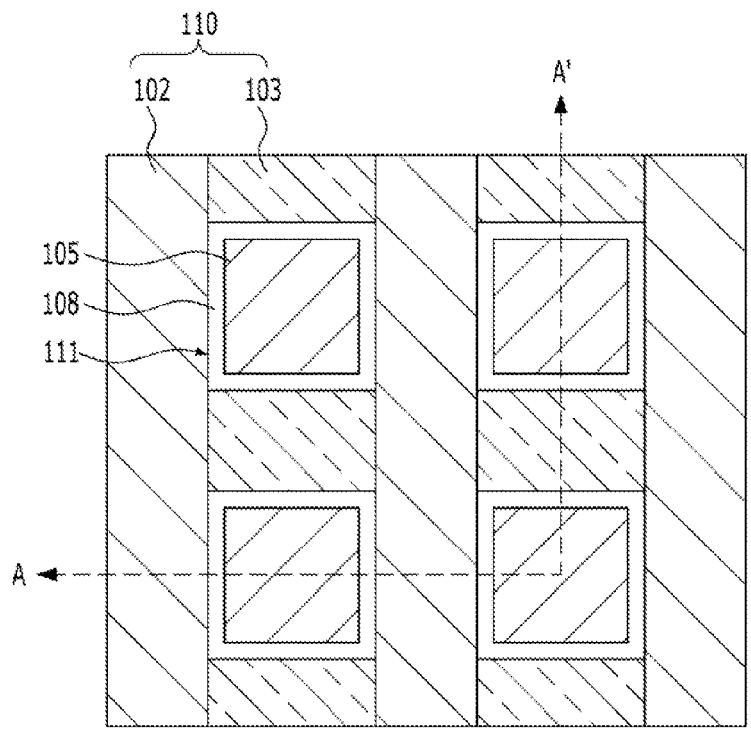
FIG. 1A is a plan view illustrating a semiconductor device in accordance with a first exemplary implementation.

Various exemplary implementations will be described below in more detail with reference to the accompanying drawings. The present invention may, however, be embodied in different forms and should not be construed as limited to the exemplary implementations set forth herein. Rather, these exemplary implementations are provided so that this disclosure will be thorough and complete, and will fully convey the scope of the present invention to those skilled in the art. Throughout the disclosure, reference numerals correspond directly to the like numbered parts in the various figures and implementations of the present invention.

The drawings are not necessarily to scale and in some examples, proportions may have been exaggerated in order to clearly illustrate features of the exemplary implementations. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 1B:
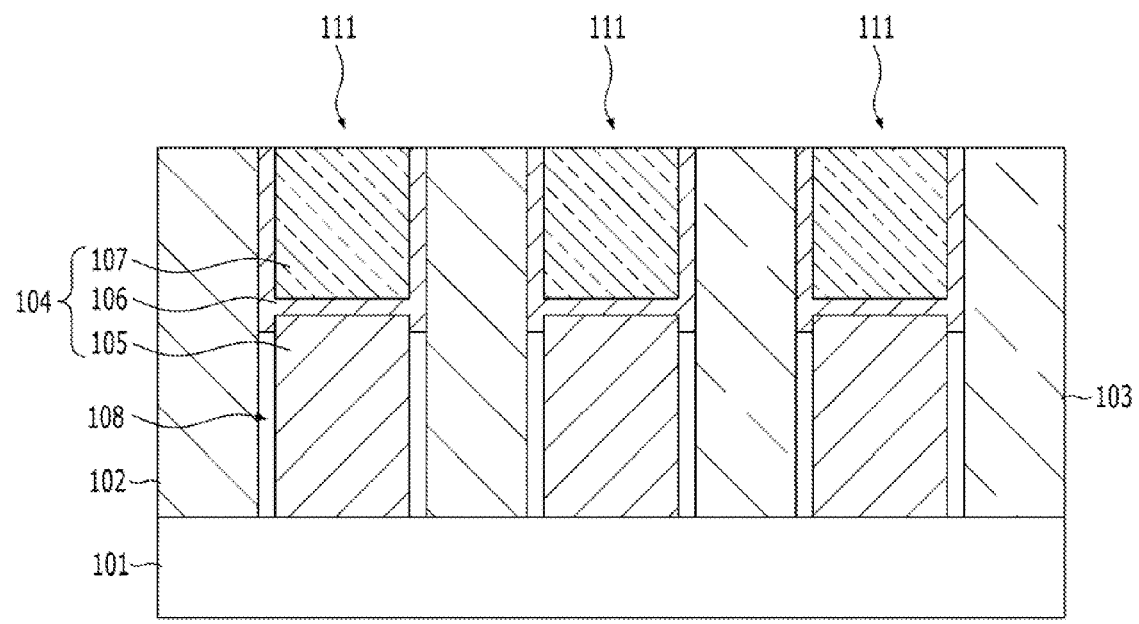
FIG. 1B is a cross-sectional view taken along the line A-A' of FIG. 1A.
Figure 1C:
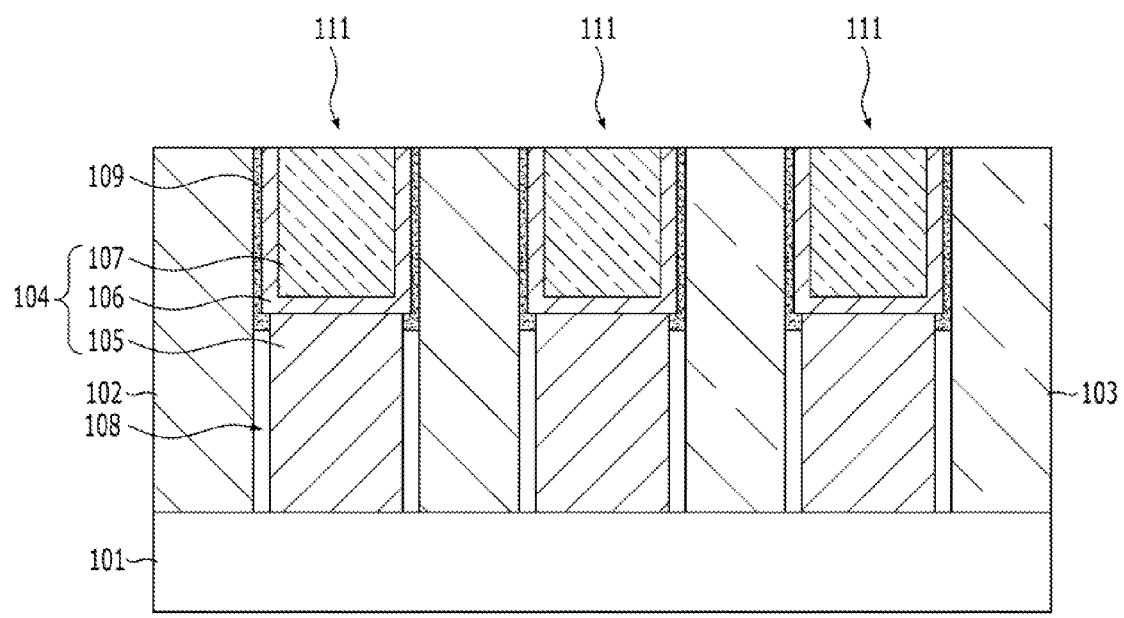
FIG. 1C is a cross-sectional view illustrating a semiconductor device in accordance with a variation of the first exemplary implementation.

FIG. 1A is a plan view illustrating a semiconductor device in accordance with a first exemplary implementation. FIG. 1B is a cross-sectional view taken along the line A-A' of FIG. 1A. FIG. 1C is a cross-sectional view illustrating a semiconductor device in accordance with a variation of the first exemplary implementation.

Referring to FIGS. 1A and 1B, isolation structures 110 may be formed in a substrate 101. Each of the isolation structures 110 may include a first isolation layer 102 and a second isolation layer 103. Openings 111 may be defined in the Isolation structures 110. Each of the openings 111 may expose a surface of the substrate 101. Conductive structures 104 may be formed in the openings 111. Each of the conductive structures 104 may include a first conductive pattern 105 and a third conductive pattern 107. The third conductive pattern 107 may be formed over the first conductive pattern 105. A second conductive pattern 106 may be formed between the first conductive pattern 105 and the third conductive pattern 107. An air gap 108 may be defined between the first conductive pattern 105 and the sidewalls of the opening 111. The first conductive pattern 105 and the air gap 108 may be capped by the second conductive pattern 106. The second conductive pattern 106 covers the top end part of the first conductive pattern 105 while capping the air gap 108. Further, the second conductive pattern 106 extends to cover the upper sidewalls of the opening 111. Accordingly, the second conductive pattern 106 may also be formed between the third conductive pattern 107 and the sidewalls of the opening 111.

The substrate 101 may include a silicon substrate, a silicon-germanium substrate or an SOI (silicon-on-insulator) substrate.

The isolation structures 110 may include a dielectric substance. The isolation structures 110 may include a silicon oxide or a silicon nitride. The isolation structures 110 may include the first isolation layer 102 and the second isolation layer 103. The first isolation layer 102 may be a line-type pattern, and the second isolation layer 103 may be substantially perpendicular to the first isolation layer 102. The second isolation layer 103 may be formed between the patterns of the first isolation layer 102. The openings 111 may be defined by the first isolation layer 102 and the second isolation layer 103.

Each opening 111 may have a hole shape or a line shape. For example, the opening 111 may be a contact hole, a via hole, a through hole, a trench, a recess, or the like. In the present exemplary implementation, the opening 111 has a hole shape. The openings 111 may be regularly arranged to form an array.

Each of the first conductive pattern 105 and the third conductive pattern 107 may include a silicon-containing substance or a metal-containing substance. The first conductive pattern 105 and the third conductive pattern 107 may include the same conductive substance or different conductive substances. For example, the first conductive pattern 105 may include a silicon-containing substance, and the third conductive pattern 107 may include a metal-containing substance. For example, the first conductive pattern 105 may include a polysilicon, and the third conductive pattern 107 may include tungsten. When the first conductive pattern 105 includes a silicon-containing substance and the third conductive pattern 107 includes a metal-containing substance, an ohmic contact is required. For such an ohmic contact, the second conductive pattern 106 is formed.

The second conductive pattern 106 may cover the top surface of the first conductive pattern 105 and the upper sidewalls of the opening 111. The second conductive pattern 106 caps the air gap 108. The second conductive pattern 106 may include a silicide. The second conductive pattern 106 may include a metal silicide. The second conductive pattern 106 may include a titanium silicide, a cobalt silicide, a nickel silicide, or a tungsten silicide. In the present exemplary implementation, the second conductive pattern 106 may include a cobalt silicide. The cobalt silicide may include a cobalt silicide with the phase of $CoSi_2$. Although further descriptions will be made later, the second conductive pattern 106 is a silicide of a silicon-containing layer.

Air gaps 108, which may be defined using a sacrificial substance, may be removed as described later.

Referring to FIG. 1C, unlike FIG. 1B, capping patterns 109 may be additionally included. Each of the capping patterns 109 may cap an air gap 108, while exposing the top surface of the first conductive pattern 105. Further, each capping pattern 109 may cover the sidewalls of the opening 111 over the air gap 108. The capping pattern 109 may be formed between the second conductive pattern 106 and the sidewalls of the opening 111 and may cap the air gap 108. The capping patterns 109 may include a silicon oxide.

A capping efficiency of the air gaps 108 is increased by the capping patterns 109.

The conductive structure 104 according to the first exemplary implementation and the variation thereof may be a plug structure. The conductive structure 104 may be a plug that connects a transistor and a memory element. The conductive structure 104 may be a plug that connects a transistor and a metal line. The first conductive pattern 105 may be a silicon plug, and the third conductive pattern 107 may be a metal plug. The second conductive pattern 106 becomes an ohmic contact layer between the silicon plug and the metal plug. The conductive structure 104, including the silicon plug and the metal plug, is referred to as a semi-metal plug (SMP).

Also, the conductive structure 104 may become a wiring layer. The wiring layer may include a bit line, a metal line, a gate electrode, a word line, a through electrode, or a pillar type channel.

While not shown, another conductive structure may be additionally formed on the conductive structure 104. Another conductive structure may be a part of a memory element that is electrically connected to the conductive structure 104. The memory element may include a capacitor that may include a storage node, a dielectric layer, or a plate node, and another conductive structure may include the storage node. The memory element may be realized in a variety of ways. For example, the memory element may include a resistance variable substance. The memory element may include a first electrode, a resistance variable substance, and a second electrode, which may be sequentially stacked, and the first electrode may be electrically connected to the conductive structure 104. Information may be stored due to the fact that the resistance of the resistance variable substance is changed according to the voltages applied to the first electrode and the second electrode. The resistance variable substance may include a phase change substance or a magnetic tunnel junction.

While not shown, a transistor that may include a gate electrode, a source region, and a drain region may be additionally formed. The conductive structure 104 may be connected to the source region or the drain region of the transistor. The transistor may include a planar gate type transistor, a trench gate type transistor, a buried gate type transistor, a recess gate type transistor, or a vertical channel transistor. Each of the trench gate type transistor, the buried gate type transistor, or the recess gate type transistor may have a structure in which a portion of a gate electrode is extended into or buried in the substrate 101.

FIGS. 2A to 2H are plan views showing an exemplary method of fabricating the semiconductor device in accordance with the first exemplary implementation. FIGS. 3A to 3H are cross-sectional views showing the exemplary method of fabricating the semiconductor device in accordance with the first exemplary implementation. FIGS. 3A to 3H are cross-sectional views taken along the lines A-A' of FIGS. 2A to 2H.

Figure 2A:
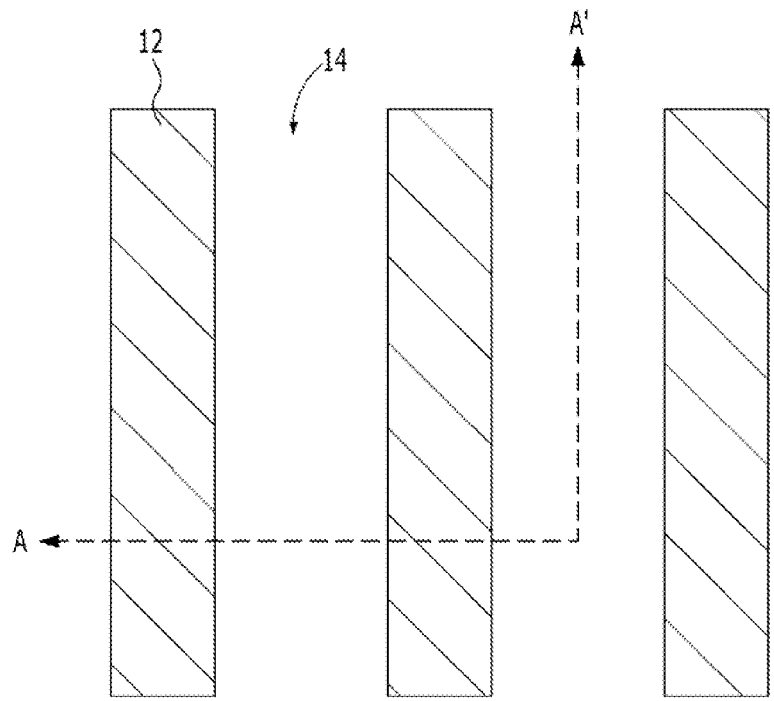
FIGS. 2A to 2H are plan views showing an exemplary method of fabricating the semiconductor device in accordance with the first exemplary implementation.
Figure 3A:
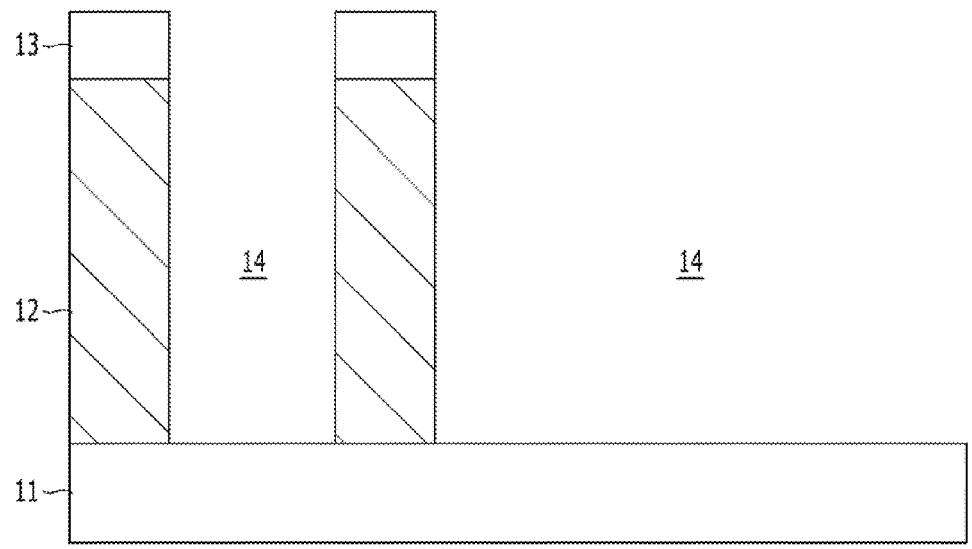
FIGS. 3A to 3H are cross-sectional views showing the exemplary method of fabricating the semiconductor device in accordance with the first exemplary implementation.

Referring to FIGS. 2A and 3A, a first isolation layer 12 may be formed on a substrate 11. The substrate 11 may include a semiconductor substrate. The substrate 11 may include a silicon substrate, a silicon-germanium substrate or an SOI substrate. The first isolation layer 12 may include line type patterns that extend in a first direction. The first isolation layer 12 may be formed through an etching process using first mask patterns 13. The first mask patterns 13 may include photoresist patterns. In another exemplary implementation, the first mask patterns 13 may include hard mask patterns that may be formed by etching photoresist patterns. Trenches 14 may separate the patterns of the first isolation layer 12 from one another. The first isolation layer 12 may include a dielectric substance. The first isolation layer 12 may include a silicon oxide or a silicon nitride. While not shown, the first isolation layer 12 may be the uppermost layer of a stack structure. The stack structure may include multiple layers of dielectric substances.

Figure 2B:
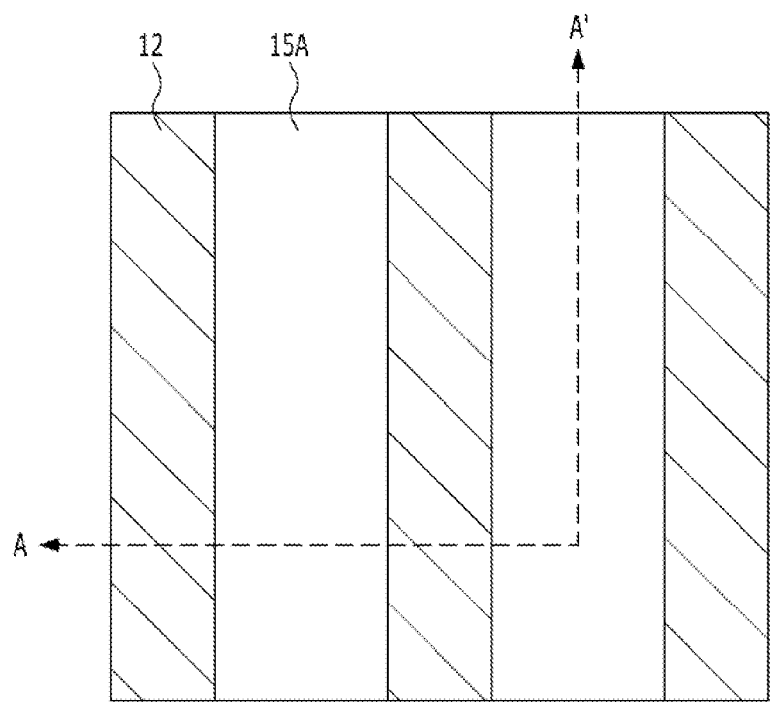
Figure 3B:
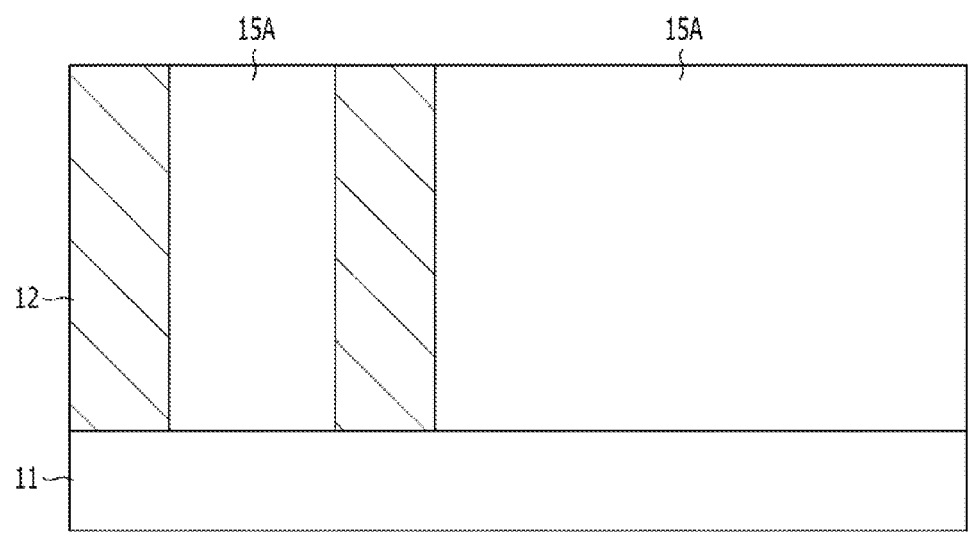

Referring to FIGS. 2B and 3B, the first mask patterns 13 may be removed.

A sacrificial layer 15A may be formed. The sacrificial layer 15A may include a dielectric substance. The sacrificial layer 15A may include a substance that has an etching selectivity to the first isolation layer 12. An etching rate of the sacrificial layer 15A is greater than the first isolation layer 12. That is, the first isolation layer 12 is not removed while the sacrificial layer 15A is removed in a subsequent process. If the first isolation layer 12 includes a silicon nitride, then the sacrificial layer 15A may include a silicon oxide. After the sacrificial layer 15A is formed to fill the trenches 14, the sacrificial layer 15A may be planarized to expose the surface of the first isolation layer 12.

Figure 2C:
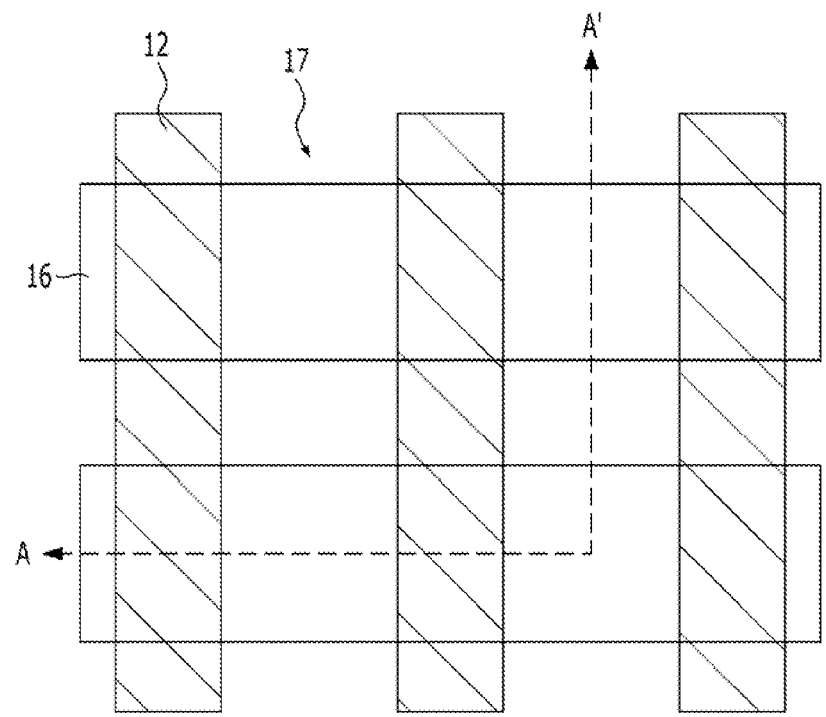
Figure 3C:
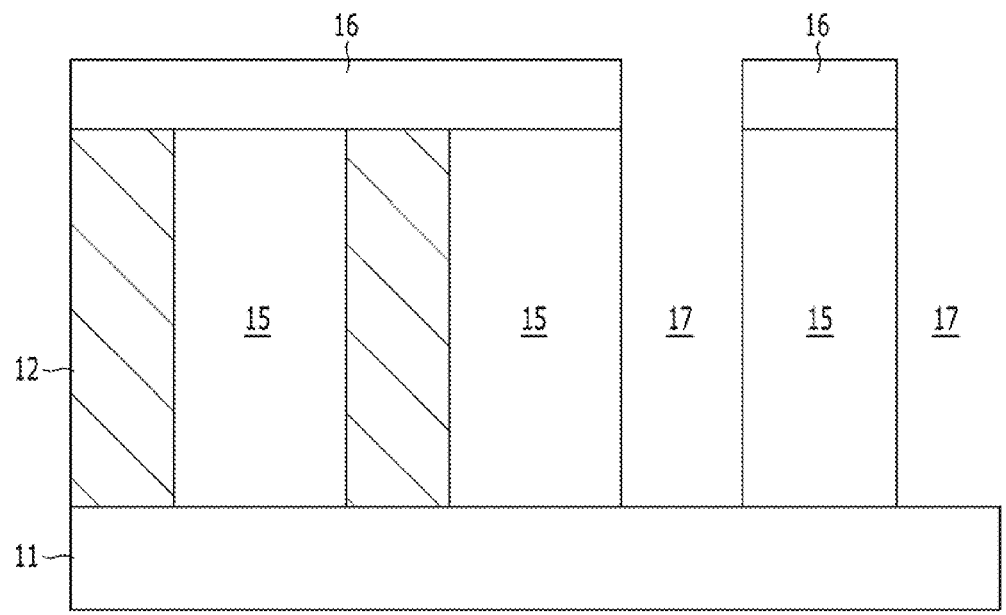

Referring to FIGS. 2C and 3C, second mask patterns 16 may be formed. The second mask patterns 16 may extend in a second direction that crosses with the first isolation layer 12. The second mask patterns 16 may include photoresist patterns or may include hard mask patterns that may be patterned using photoresist patterns.

Sacrificial patterns 15 may be formed. The sacrificial patterns 15 may be formed through etching of the sacrificial layer 15A. The sacrificial layer 15A is etched using the second mask patterns 16 as etch masks. Accordingly, the sacrificial patterns 15 may be formed between the patterns of the first isolation layer 12, and a structure in which the sacrificial patterns 15 and the patterns of the first isolation layer 12 cross each other may be formed on the substrate 11. Pre-isolation parts 17 may be defined between the sacrificial patterns 15.

Figure 2D:
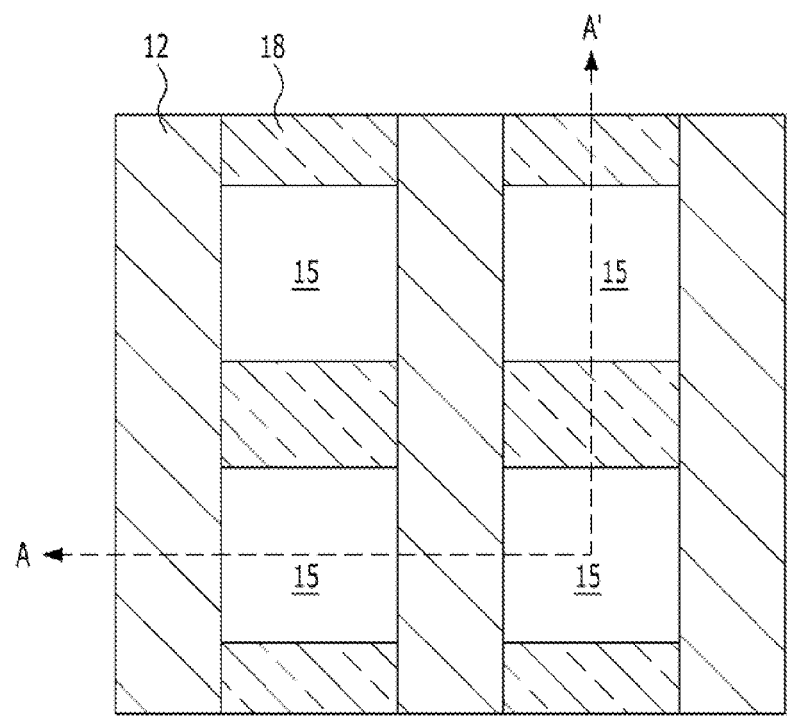
Figure 3D:
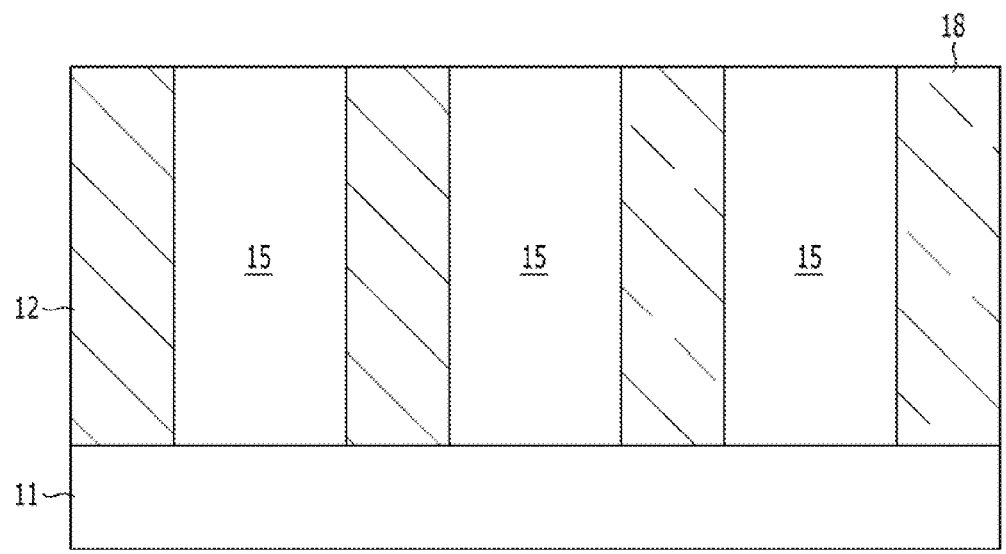

Referring to FIGS. 2D and 3D, the second mask patterns 16 are removed.

A second isolation layer 18 is formed in the pre-isolation parts 17. The second isolation layer 18 may include a dielectric substance. The second isolation layer 18 may include the same material as the first isolation layer 12. For example, the second isolation layer 18 may include a silicon nitride. The second isolation layer 18 has a shape that crosses with the first isolation layer 12. After the second isolation layer 18 is formed on the entire surface to fill the pre-isolation parts 17, the second isolation layer 18 may be planarized to expose the surfaces of the sacrificial patterns 15.

Figure 2E:
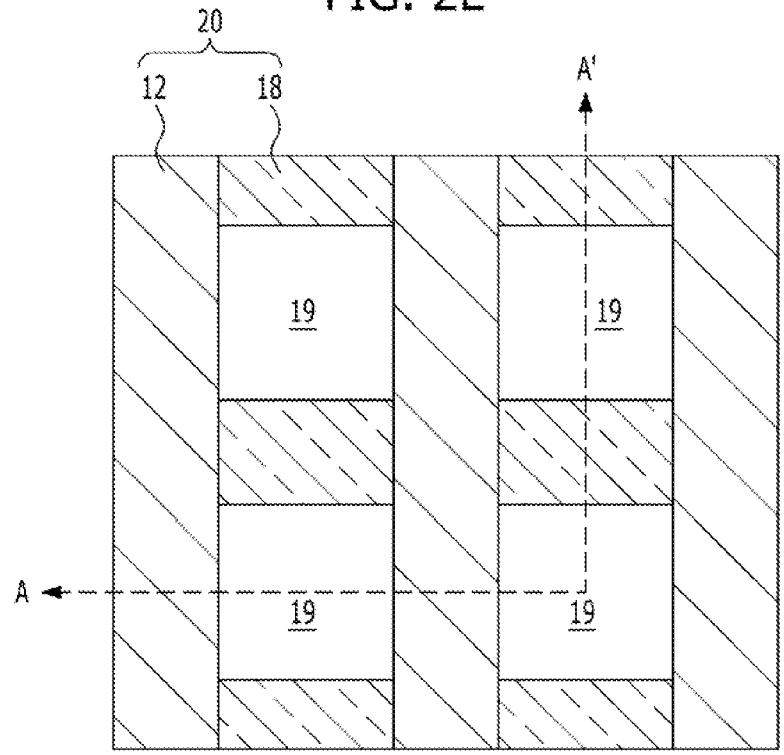
Figure 3E:
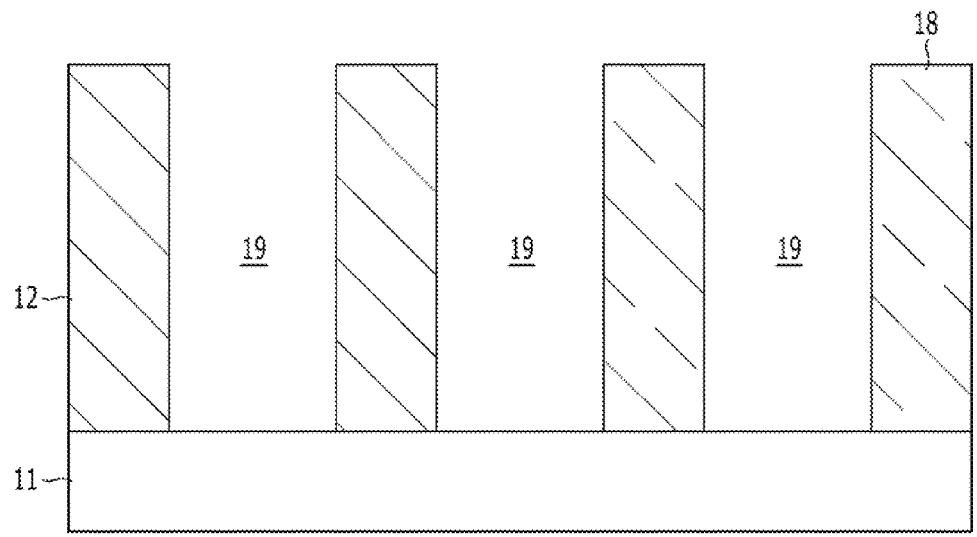

Referring to FIGS. 2E and 3E, the sacrificial patterns 15 may be removed. According to this fact, openings 19 may be defined. The sacrificial patterns 15 may be removed through wet etching. If the sacrificial patterns 15 include a silicon oxide, then the sacrificial patterns 15 may be removed using a BOE (buffered oxide etch) solution. While the sacrificial patterns 15 may be removed, the first isolation layer 12 and the second isolation layer 18 may be not removed since they have etching selectivity to the sacrificial patterns 15. An etching rate of the sacrificial patterns 15 is greater than the first isolation layer 12 and the second isolation layer 18. That is, the first isolation layer 12 and the second isolation layer 18 are not removed while the sacrificial layer 15A is removed.

As the sacrificial patterns 15 may be removed in this way, the first isolation layer 12 and the second isolation layer 18 remain. Openings 19 may be defined by crossing of the first isolation layer 12 and the second isolation layer 18. The series of processes of forming the first isolation layer 12, the sacrificial layer 15A, the second mask patterns 16, the sacrificial patterns 15, the second isolation layer 18 and the openings 19 may be collectively referred to as a damascene process. The openings 19, which may be defined by the damascene process, may be distinguished from openings that may be defined by using conventional mask patterns and through conventional etching. In general, openings may be defined through etching an isolation layer by using mask patterns as etch masks. In the present exemplary implementation, as the openings 19 are defined through the damascene process, the openings 19 may be easily defined to have a high aspect ratio. Also, the profiles of the openings 19 are improved.

Isolation structures 20 may include the first isolation layer 12 and the second isolation layer 18. The isolation structures 20 include the openings 19. The isolation structures 20 may include a silicon nitride. Each of the openings 19 may be a contact hole, a via hole, a through hole, a trench, or a recess. The openings 19 may be arranged at regular intervals to form an opening array. The surface of the substrate 11 may be exposed by the openings 19.

Figure 2F:
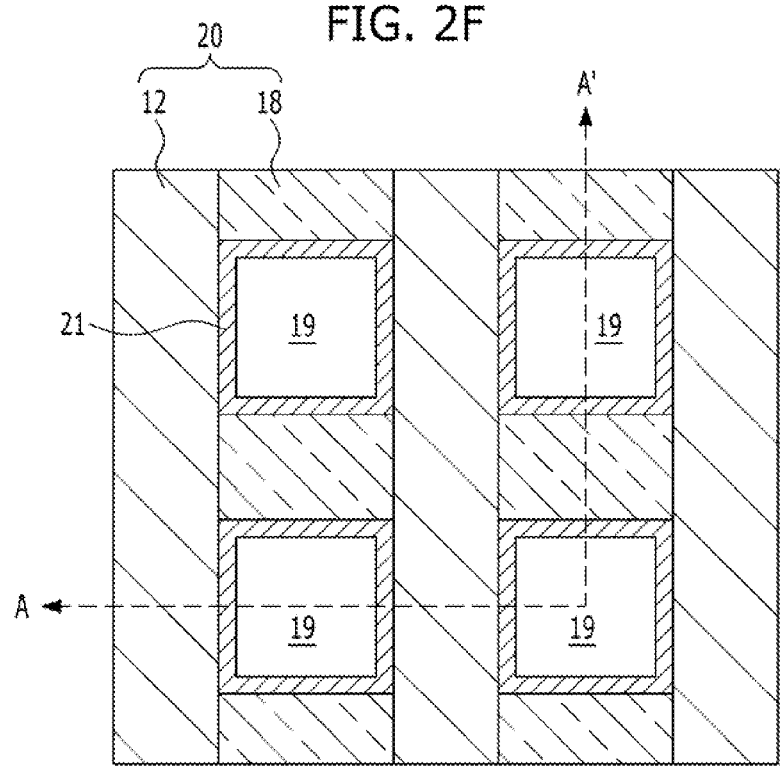
Figure 3F:
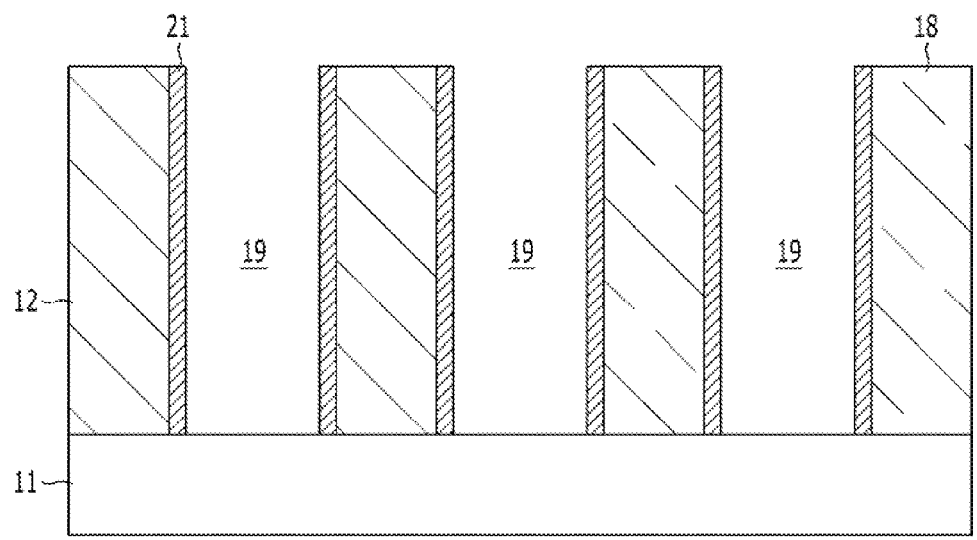

Referring to FIGS. 2F and 3F, sacrificial spacers 21 may be formed. The sacrificial spacers 21 may be formed through etching of a sacrificial layer (not shown). The sacrificial layer may be conformally formed on the entire surface including the openings 19 and the isolation structures 20. The sacrificial spacers 21 may include a substance that is removed by wet etching. The sacrificial spacers 21 may include a substance different from the isolation structures 20. The sacrificial spacers 21 may include a substance that has an etching selectivity to the isolation structures 20. For example, upon wet etching of the sacrificial spacers 21, the isolation structures 20 may be not etched and remain. The sacrificial spacers 21 may include an oxide. The sacrificial spacers 21 may include a silicon oxide. The sacrificial spacers 21 may include an ultra low temperature oxide (ULTO). In order to form the sacrificial spacers 21, deposition and etch-back processes of a sacrificial layer may be performed.

Figure 2G:
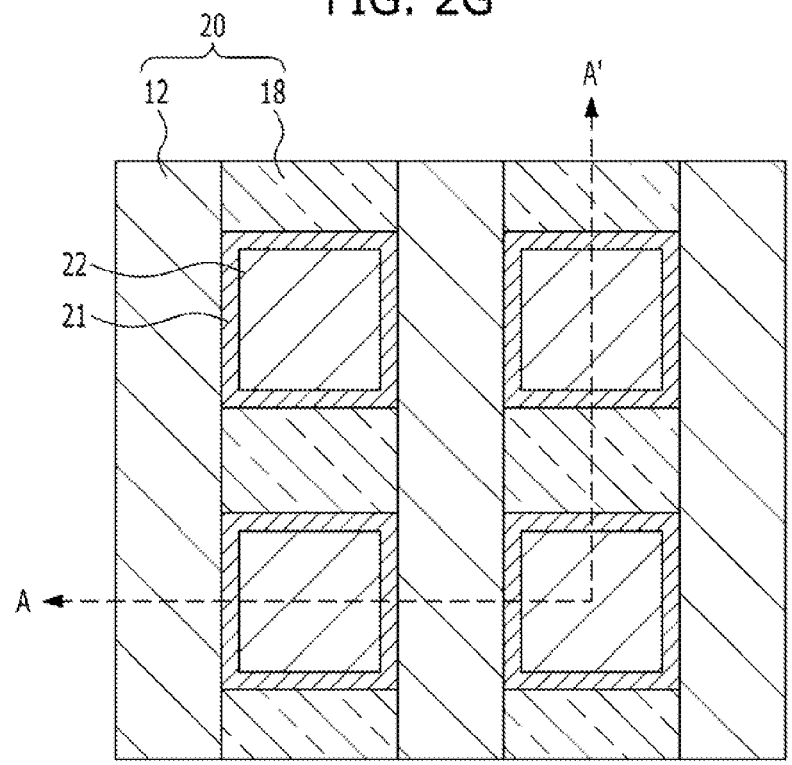
Figure 3G:
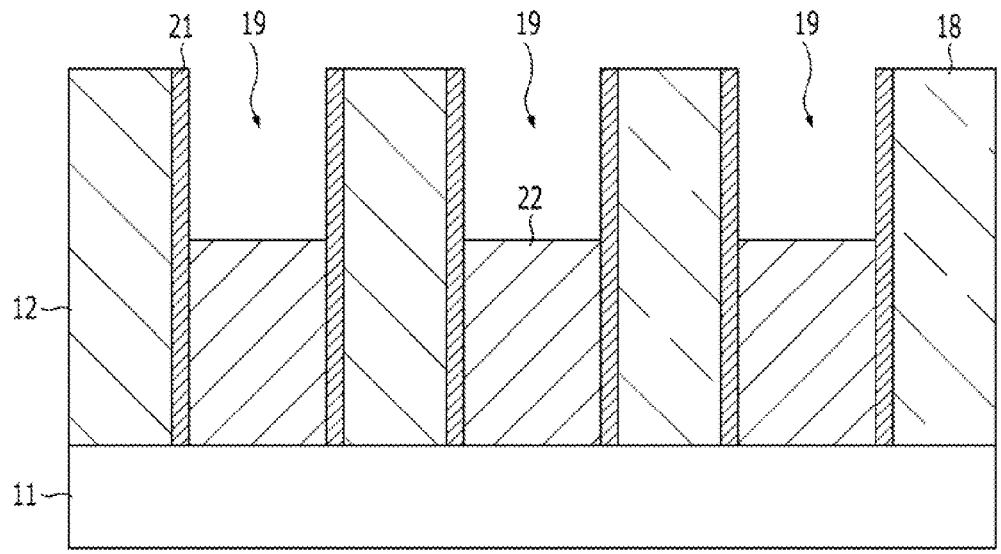

Referring to FIGS. 2G and 3G, first conductive patterns 22 may be formed. The first conductive patterns 22 may be formed to be recessed in the openings 19. A first conductive layer (not shown) may be formed on the isolation structures 20 while filling the openings 19. By selectively removing the first conductive layer, the first conductive patterns 22 may be formed in the openings 19. In order to form the first conductive patterns 22, an etch-back process of the first conductive layer may be performed. The first conductive patterns 22 may include a silicon-containing substance. The first conductive patterns 22 may include a polysilicon. An impurity may be doped into the polysilicon. The first conductive patterns 22 contact the surface of the substrate 11. The first conductive patterns 22 may have a height that is recessed to be lower than the top surface of the first isolation layer 12. Portions of the sacrificial spacers 21 may be exposed by the first conductive patterns 22.

Figure 2H:
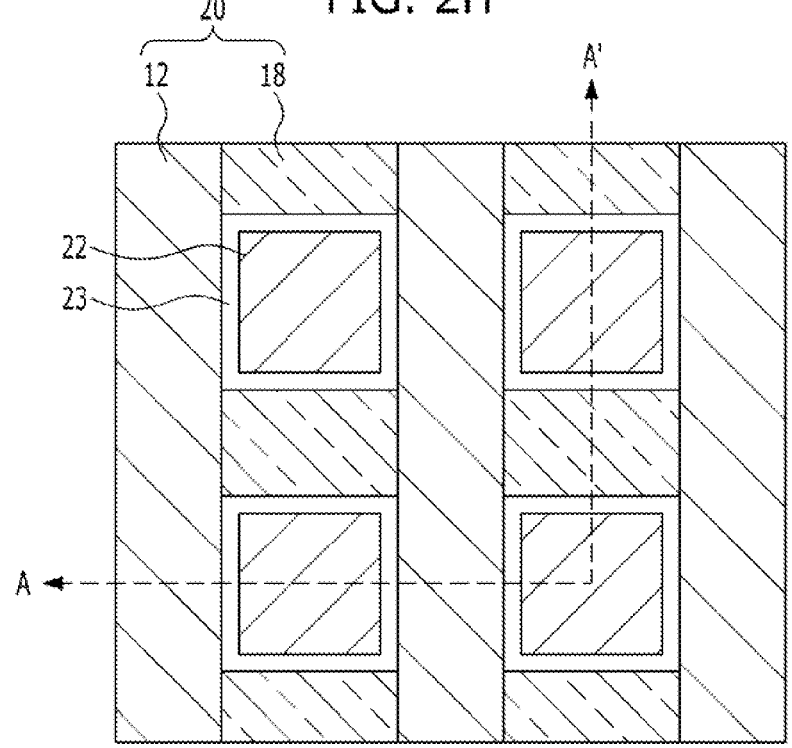
Figure 3H:
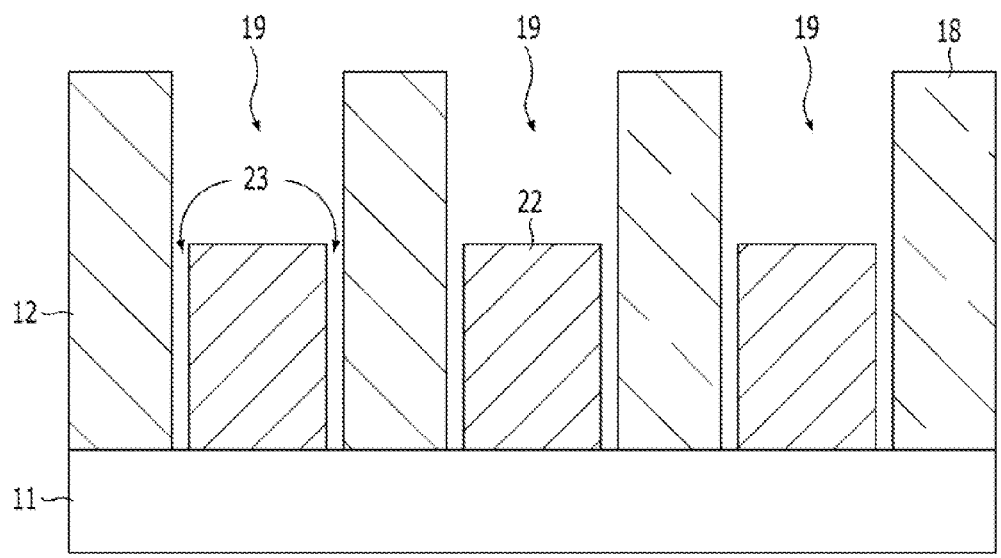

Referring to FIGS. 2H and 3H, the sacrificial spacers 21 may be removed. In order to remove the sacrificial spacers 21, a strip process may be performed. The strip process may include a cleaning process. The cleaning process may use a wet chemical capable of removing the sacrificial spacers 21.

As the strip process removes the sacrificial spacers 21, the spaces having been occupied by the sacrificial spacers 21 remain as air gaps 23.

The air gaps 23 may be defined between the first conductive patterns 22 and the sidewalls of the openings 19. Each of the air gaps 23 has a shape that surrounds the sides of the first conductive pattern 22. Each air gap 23 is defined between the isolation structure 20 and the first conductive pattern 22.

FIGS. 4A to 4E are views explaining an exemplary method of capping air gaps in the semiconductor device in accordance with the first exemplary implementation.

Figure 4A:
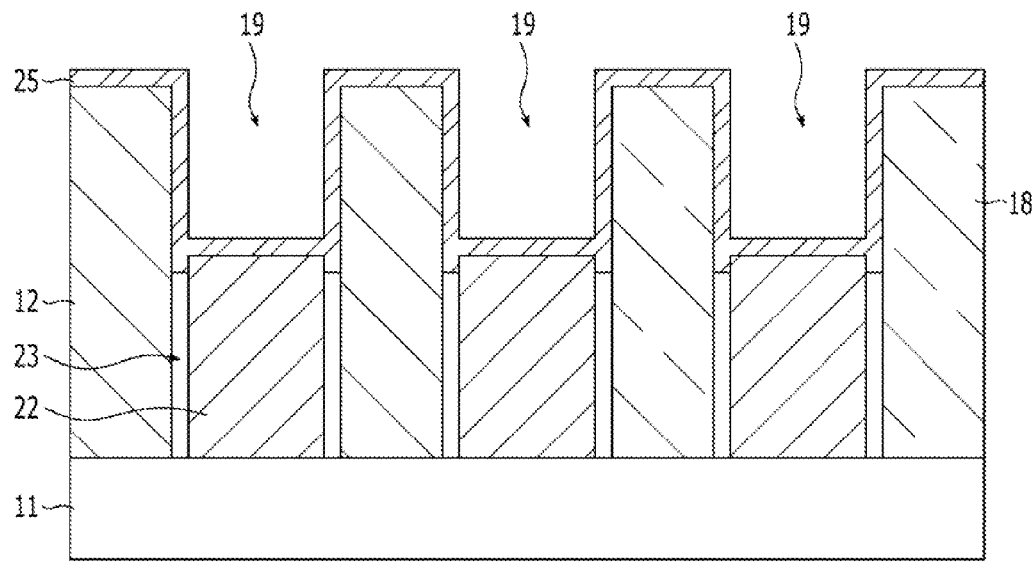
FIGS. 4A to 4E are views explaining an exemplary method of capping air gaps in the semiconductor device in accordance with the first exemplary implementation.

Referring to FIG. 4A, a liner layer 25 may be uniformly formed. The liner layer 25 may include a silicon-containing substance. The liner layer 25 may include a polysilicon layer. The liner layer 25 performs the function of a capping layer of the air gaps 23. It is necessary for the liner layer 25 to be uniformly deposited. To this end, a seed layer, such as disilane, may be first deposited to improve roughness.

The liner layer 25 may have a uniform thickness that covers the top surfaces of the first conductive patterns 22. The liner layer 25 may be formed on the entire structure, including the top surfaces of the first conductive patterns 22. Accordingly, the liner layer 25 may be formed on the upper sidewalls of the openings 19.

The liner layer 25 may suppress the influence of the voids generated in the first conductive patterns 22. Moreover, the liner layer 25 may serve as a source substance in which a metal silicide may be formed. A sufficient amount of silicon for allowing a metal silicide to be uniformly formed may be provided by the liner layer 25. Since a polysilicon layer to be used as the liner layer 25 may be uniformly formed, the liner layer 25 may be formed without filling the air gaps 23. That is to say, the liner layer 25 does not flow to the bottoms of the air gaps 23 and is formed in only the top end parts of the air gaps 23.

Figure 4B:
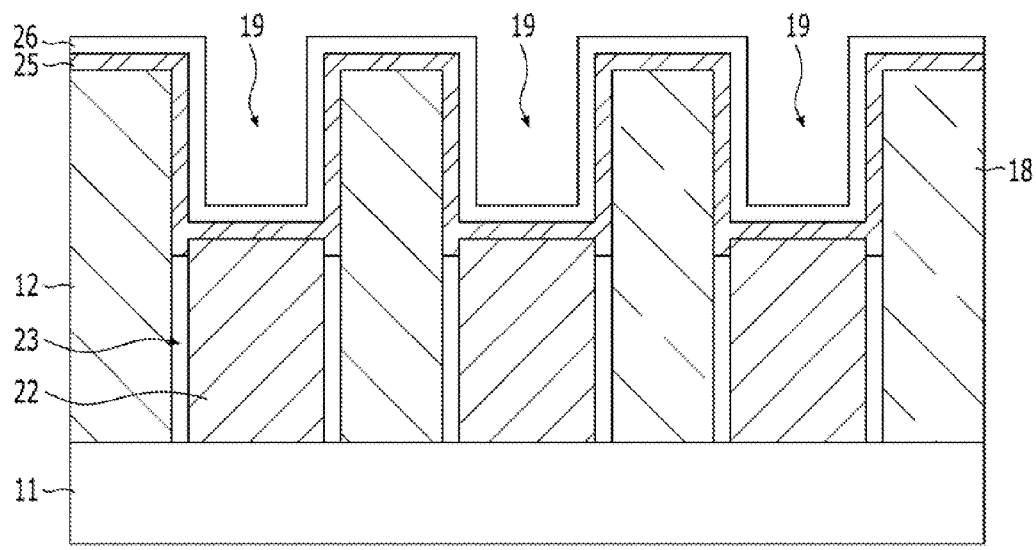

Referring to FIG. 4B, a silicidable layer 26 may be formed on the liner layer 25. Before forming the silicidable layer 26, pre-cleaning may be performed. This is referred to as silicidable layer pre-cleaning. By performing the pre-cleaning, a surface on which the silicidable layer 26 is to be formed may be kept clean. According to this fact, the uniformity of a silicide may be secured. Even though the pre-cleaning is performed before forming the silicidable layer 26, the air gaps 23 may be protected by the liner layer 25. If the pre-cleaning is performed in the absence of the liner layer 25, then the voids generated in the first conductive patterns 22 may be enlarged or the air gaps 23 may be lost.

The silicidable layer 26 may be formed on the entire structure over the liner layer 25. The silicidable layer 26 may include a substance that may form a silicide by reacting with the liner layer 25. The silicidable layer 26 may include a silicidable metal. For example, the silicidable metal may include titanium, cobalt, tungsten, or nickel. The silicidable layer 26 may be formed through chemical vapor deposition (CVD). Accordingly, the silicidable layer 26 may be formed with a uniform thickness on the surface of the liner layer 25. The above-described silicidable metals may be all conductive substances.

Hereinafter, in the present exemplary implementation, the silicidable layer 26 may include, for example, cobalt. While not shown, a protective layer may be formed on the silicidable layer 26. The protective layer may substantially prevent a subsequently formed silicide layer from being attacked. The protective layer may include, for example, a metal nitride or a titanium-containing substance. For example, the protective layer may include a titanium nitride. For example, the protective layer may be formed by stacking titanium and a titanium nitride.

According to the above descriptions, since the silicidable layer 26 covers the liner layer 25, the contact area between the silicidable layer 26 and the liner layer 25 increases. Thus, an area over which a silicide layer will be subsequently formed increases.

Figure 4C:
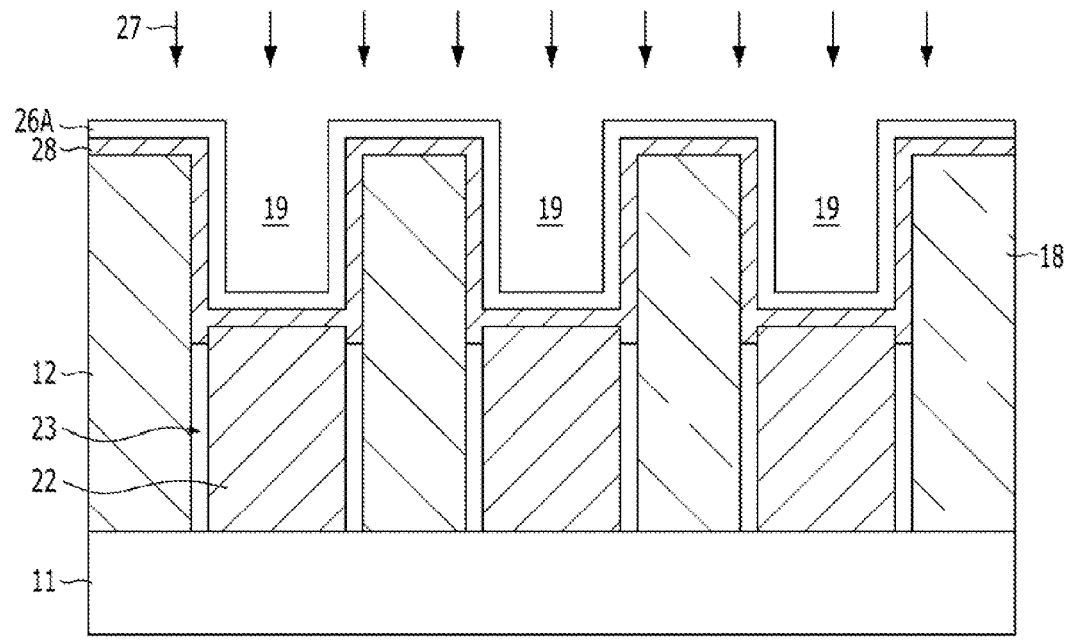

Referring to FIG. 4C, second conductive patterns 28 may be formed. The second conductive patterns 28 may be formed through silicidation of the liner layer 25. In order to form the second conductive patterns 28, a thermal process may be performed. The thermal process may include annealing 27. The annealing 27 makes the silicidation of the liner layer 25 possible. By the annealing 27, the liner layer 25 and the silicidable layer 26 react with each other. Elaborating on this, a silicidation reaction occurs between the liner layer 25 and the silicidable layer 26. According to this fact, a silicide layer is formed. The silicide layer becomes the second conductive patterns 28. The second conductive patterns 28 perform the function of an ohmic contact layer. The annealing 27 may be performed at a temperature of at least 200° C. The annealing 27 may include rapid thermal annealing (RTA).

As the annealing 27 is performed, the silicon of the liner layer 25 and the metal of the silicidable layer 26 react with each other, and a metal silicide layer is formed. The metal silicide layer may include a titanium silicide, a cobalt silicide, a nickel silicide, or a tungsten silicide. Since the liner layer 25 may include a polysilicon and the silicidable layer 26 may include cobalt, a cobalt silicide layer may be formed through the annealing 27.

For example, in order to form the cobalt silicide layer, the annealing 27 may be performed twice. By primary annealing, a cobalt silicide layer with the phase of $CoSi_x$ (x=about 0.1~about 1.5) is formed. Secondary annealing is performed after the primary annealing. The secondary annealing may be performed at a temperature higher than the primary annealing. The secondary annealing is performed at a temperature of about 600° C. to about 800° C. A phase change of the cobalt silicide layer occurs by the secondary annealing. For example, a phase change to a cobalt silicide layer with the phase of $CoSi_2$ occurs by the secondary annealing. The resistivity of the cobalt silicide layer with the phase of $CoSi_2$ is lower than the cobalt silicide layer with the phase of $CoSi_x$ (x=about 0.1~about 1.5). By forming the cobalt silicide layer with the phase of $CoSi_2$, contact resistance may be reduced, and at the same time, it is possible to form a cobalt silicide layer with low resistance even in the small area of each opening 19 with a fine line width. The secondary annealing may be performed after removing an unreacted silicidable layer 26A.

Because the second conductive patterns 28 may be formed by consuming the silicon of the liner layer 25, the liner layer 25 may not remain. Namely, the liner layer 25 provides a sufficient amount of silicon capable of forming the second conductive patterns 28 during the annealing 27. Accordingly, as the liner layer 25 is sufficiently silicidated, the second conductive patterns 28 may be uniformly formed. The liner layer 25 may be fully silicidated, and this is referred to as full silicidation. After the annealing 27, the first conductive patterns 22 may be covered by the second conductive patterns 28. Furthermore, the air gaps 23 may be capped by the second conductive patterns 28.

As described above, the second conductive patterns 28 may be formed by the annealing 27. The top surfaces of the first conductive patterns 22 and the air gaps 23 may be capped by the second conductive patterns 28. The second conductive patterns 28 serve as an ohmic contact layer between the first conductive patterns 22 and third conductive patterns, which will be subsequently formed. Since the second conductive patterns 28 may be formed through silicidation of the liner layer 25, the second conductive patterns 28 may be uniformly formed. Since the liner layer 25 suppresses the influence by the voids generated in the first conductive patterns 22, the silicidation is not adversely influenced by the voids, and thus, the uniformity of the second conductive patterns 28 may be further secured. Meanwhile, if a silicidation reaction occurs in the absence of the liner layer 25, then a silicide layer will be non-uniformly formed by the influence of the voids generated in the first conductive patterns 22.

Any unreacted silicidable layer 26A may remain on the second conductive patterns 28.

Meanwhile, as a comparative example, a metal silicide layer may be directly deposited to cap the air gaps 23. However, if the metal silicide layer is directly deposited, as a deposition source substance flows into the air gaps 23, the air gaps 23 may be filled with the metal silicide layer. Therefore, if the air gaps 23 are capped by directly depositing the metal silicide layer, then the air gaps 23 are likely to be filled and thus parasitic capacitance may not be reduced.

Figure 4D:
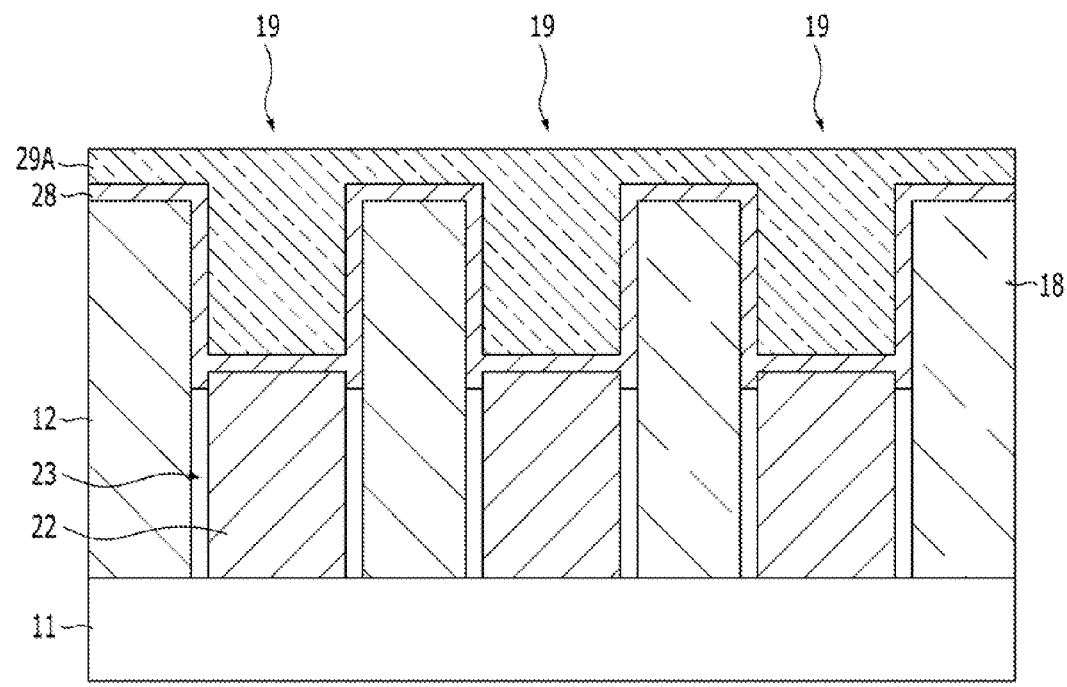

Referring to FIG. 4D, the unreacted silicidable layer 26A is removed. In order to remove the unreacted silicidable layer 26A, a strip process may be performed. The strip process may include cleaning using a wet chemical. While the unreacted silicidable layer 26A is removed, the loss of the air gaps 23 is substantially prevented by the presence of the second conductive patterns 28.

A third conductive layer 29A may be formed. The third conductive layer 29A may fill the openings 19 on the second conductive patterns 28. The third conductive layer 29A may include a metal-containing layer. The third conductive layer 29A may include a tungsten layer.

Figure 4E:
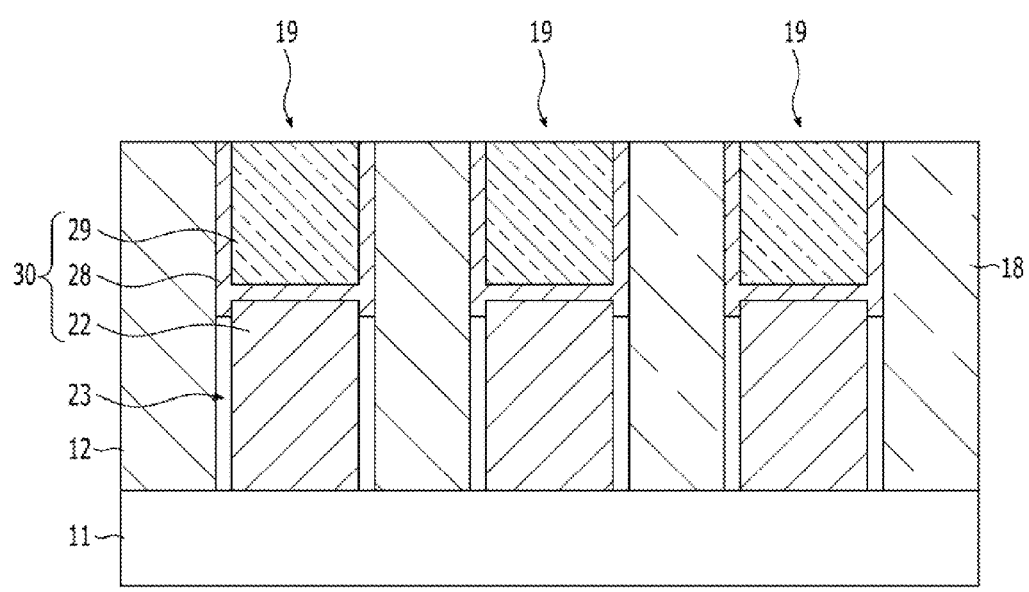

Referring to FIG. 4E, third conductive patterns 29 may be formed. The third conductive patterns 29 may be formed through planarization of the third conductive layer 29A. The third conductive patterns 29 may fill the remaining portions of the openings 19 on the second conductive patterns 28. For the planarization of the third conductive layer 29A to form the third conductive patterns 29, an etch-back process or a CMP (chemical mechanical polishing) process may be applied. At this time, the second conductive patterns 28 may be planarized as well. The second conductive patterns 28 may be removed on the top surfaces of the first isolation layer 12 and the second isolation layer 18.

Accordingly, conductive structures 30 formed in the openings 19 include the first conductive patterns 22, the second conductive patterns 28 and the third conductive patterns 29. The air gaps 23 may be defined between the conductive structures 30 and the sidewalls of the openings 19. The second conductive patterns 28 form ohmic contacts between the first conductive patterns 22 and the third conductive patterns 29. The air gaps 23 may be defined between the first conductive patterns 22 and the sidewalls of the openings 19. The air gaps 23 and the first conductive patterns 22 may be capped by the second conductive patterns 28.

FIGS. 5A to 5D may be views explaining another exemplary method of capping air gaps in the semiconductor device in accordance with the first exemplary implementation.

Figure 5A:
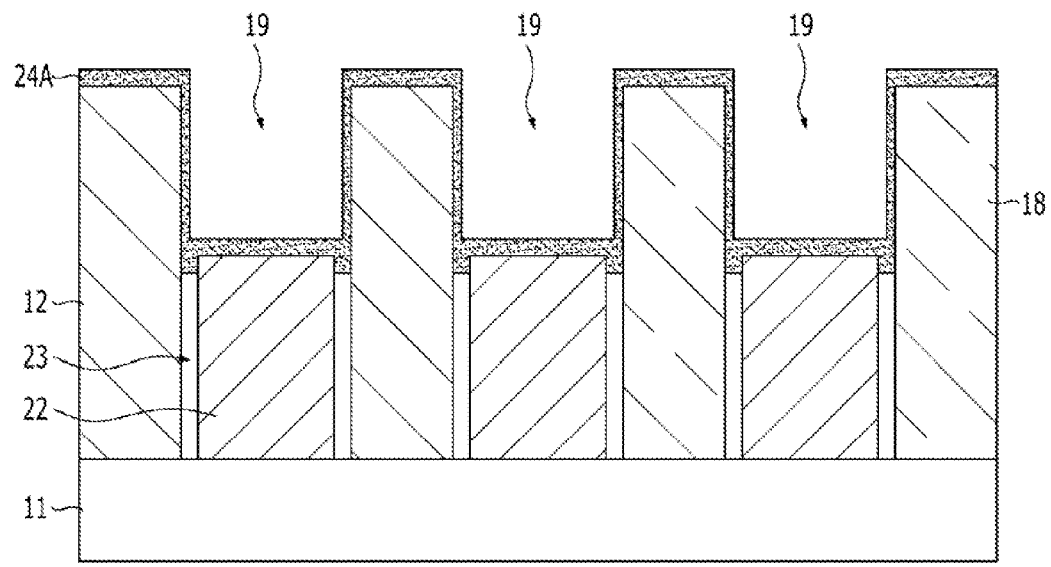
FIGS. 5A to 5D are views explaining another exemplary method of capping air gaps in the semiconductor device in accordance with the first exemplary implementation.

Referring to FIG. 5A, a capping layer 24A may be formed on the entire surface including the air gaps 23 and the first conductive patterns 22. The capping layer 24A caps the first conductive patterns 22 and the air gaps 23. The capping layer 24A may include an oxide. The capping layer 24A may include a silicon oxide. The capping layer 24A may be formed through plasma oxidation. By the plasma oxidation, the capping layer 24A with a poor step coverage may be formed. For example, the thickness of the capping layer 24A formed on the surfaces of the first conductive patterns 22 is larger than the thickness of the capping layer 24A formed on the sidewalls of the openings 19. Thus, the capping layer 24A is not formed in the deep portions of the air gaps 23. Consequently, by forming the capping layer 24A through the plasma oxidation, the top ends of the air gaps 23 may be sufficiently capped. In another exemplary implementation, a capping substance may be additionally formed after the plasma oxidation, so that the capping efficiency of the air gaps 23 may be reinforced. The capping reinforcing substance may include an ultra low temperature oxide (ULTO).

Figure 5B:
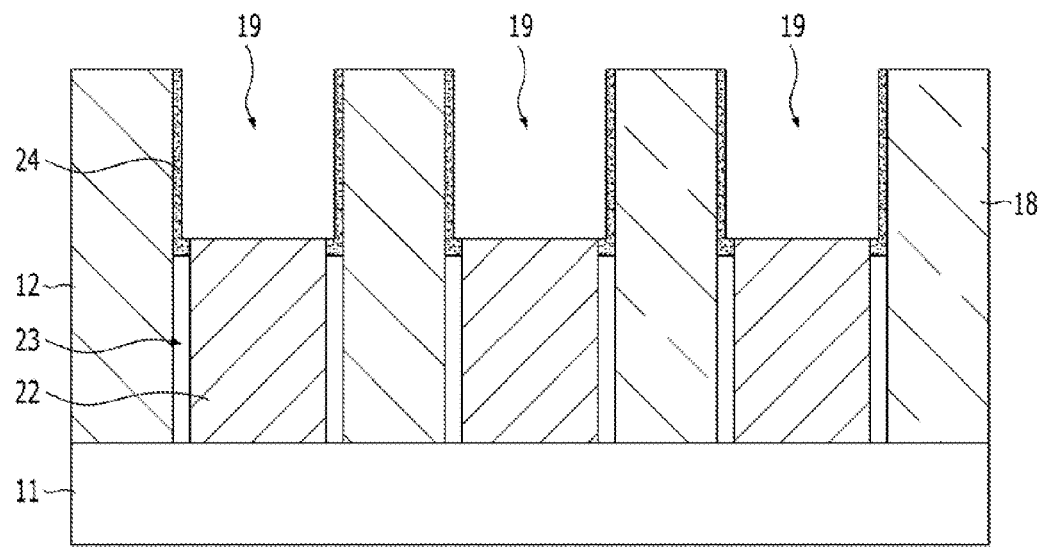

Referring to FIG. 5B, the surfaces of the first conductive patterns 22 may be exposed. To this end, cleaning may be performed. By the cleaning, portions of the capping layer 24A may be etched, and accordingly, the top surfaces of the first conductive patterns 22 may be exposed. After the cleaning, the capping layer 24A remains as capping patterns 24. The capping patterns 24 cap the air gaps 23 while exposing the top surfaces of the first conductive patterns 22, and cover the upper sidewalls of the openings 19 over the first conductive patterns 22.

As the cleaning for forming the capping patterns 24, dry cleaning is applied. By applying the dry cleaning, the residual thickness of the capping patterns 24 that caps the air gaps 23 may be sufficiently controlled. Meanwhile, if wet cleaning is used, it may be difficult to control the residual thickness of the capping patterns 24, and accordingly, the air gaps 23 are likely to be exposed.

Figure 5C:
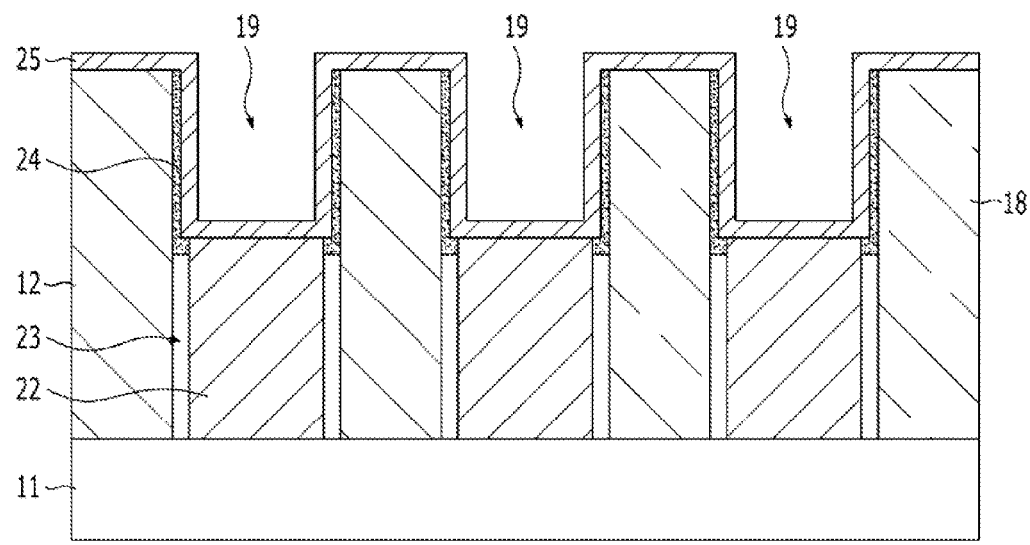

Referring to FIG. 5C, a liner layer 25 may be uniformly formed. The liner layer 25 may include a silicon-containing substance. The liner layer 25 may include a polysilicon layer. The liner layer 25 performs the function of capping the air gaps 23, in cooperation with the capping patterns 24. It is necessary for the liner layer 25 to be uniformly deposited. To this end, a seed layer, such as disilane, may be first deposited to improve roughness.

The liner layer 25 has a uniform thickness that covers the top surfaces of the first conductive patterns 22 and the capping patterns 24. The liner layer 25 is formed on the entire structure including the top surfaces of the first conductive patterns 22. Accordingly, the liner layer 25 is formed also on the upper sidewalls of the openings 19. The liner layer 25 protects the capping patterns 24 from subsequent cleaning.

In this way, the capping patterns 24 and the liner layer 25 increase the capping efficiency of the air gaps 23.

Meanwhile, as a comparative example, a metal silicide layer may be directly deposited to cap the air gaps 23 and the capping patterns 24. However, if the metal silicide layer is directly deposited, as a deposition source substance flows into the air gaps 23 through weak points of the capping patterns 24, the air gaps 23 may be filled with the metal silicide layer. Therefore, if the air gaps 23 are capped by directly depositing the metal silicide layer, the air gaps 23 are likely to be filled and thus parasitic capacitance may not be reduced.

Subsequently, according to the method shown in FIGS. 48 to 4E, the second conductive patterns 28 and the third conductive patterns 29 are formed.

Figure 5D:
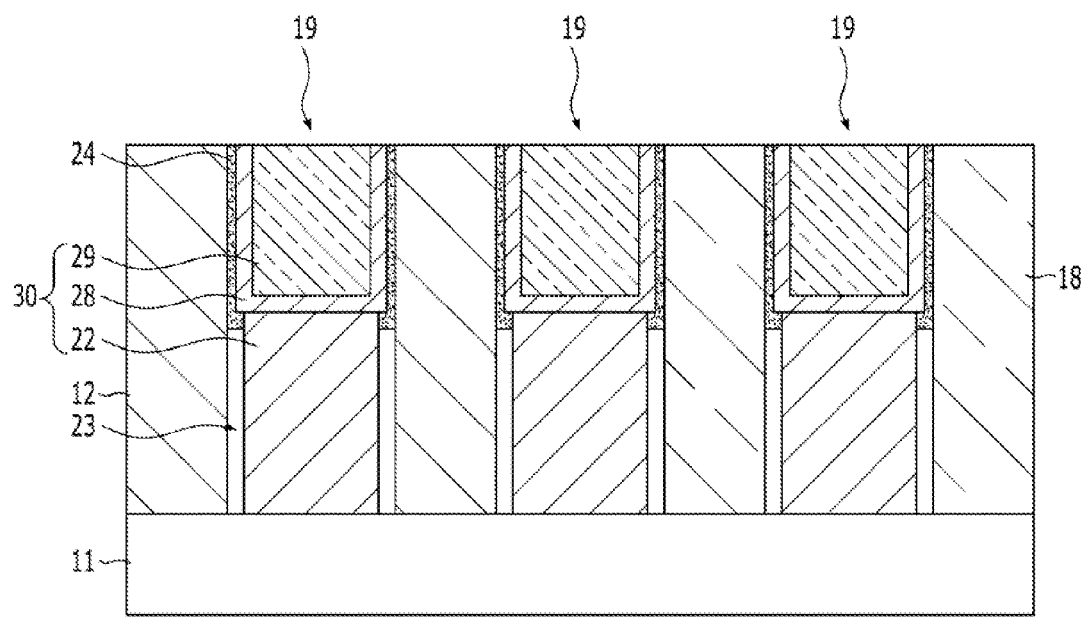

Referring to FIG. 5D, the second conductive patterns 28 may be formed through silicidation of the liner layer 25. The second conductive patterns 28 cap the top surfaces of the first conductive patterns 22 and the capping patterns 24. The capping patterns 24 may be protected by the liner layer 25 and the second conductive patterns 28, from cleaning processes that accompany a series of silicidation processes for forming the second conductive patterns 28. Accordingly, it is possible to substantially prevent the air gaps 23 from being lost.

The third conductive patterns 29 may be formed on the second conductive patterns 28.

Hence, conductive structures 30 formed in the openings 19 include the first conductive patterns 22, the second conductive patterns 28 and the third conductive patterns 29. The air gaps 23 may be defined between the conductive structures 30 and the sidewalls of the openings 19. The air gaps 23 may be defined between the first conductive patterns 22 and the sidewalls of the openings 19. The air gaps 23 may be capped by the second conductive patterns 28 and the capping patterns 24.

By the above-described capping methods, the air gaps 23 may be stably capped.

According to the first exemplary implementation and the variation thereof, since the air gaps 23 may be defined, the electrical characteristics of the conductive structures 30 may be improved. For example, if another conductive pattern is disposed neighboring each first conductive pattern 22, then the parasitic capacitance between the two conductive patterns may be reduced.

Further, since the second conductive patterns 28 include a silicide layer, the sheet resistance (Rs) of the conductive structures 30 may be reduced. In particular, since the second conductive patterns 28 include a low resistance silicide layer, the sheet resistance (Rs) of the conductive structures 30 may be further reduced. If the sheet resistance (Rs) is reduced, contact resistance (Rc) may be improved.

Moreover, since the contact may be a between the first conductive pattern 22 and the second conductive pattern 28 increases, the contact resistance of the conductive structures 30 may be further improved.

Furthermore, the air gaps 20 may be stably capped using the second conductive patterns 28 and the capping patterns 24.

Figure 6A:
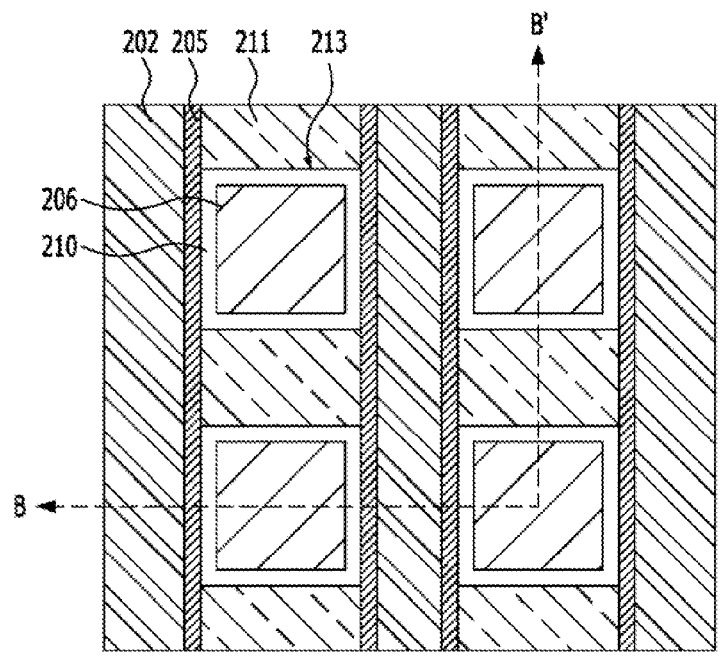
FIG. 6A is a plan view illustrating a semiconductor device in accordance with a second exemplary implementation.
Figure 6B:
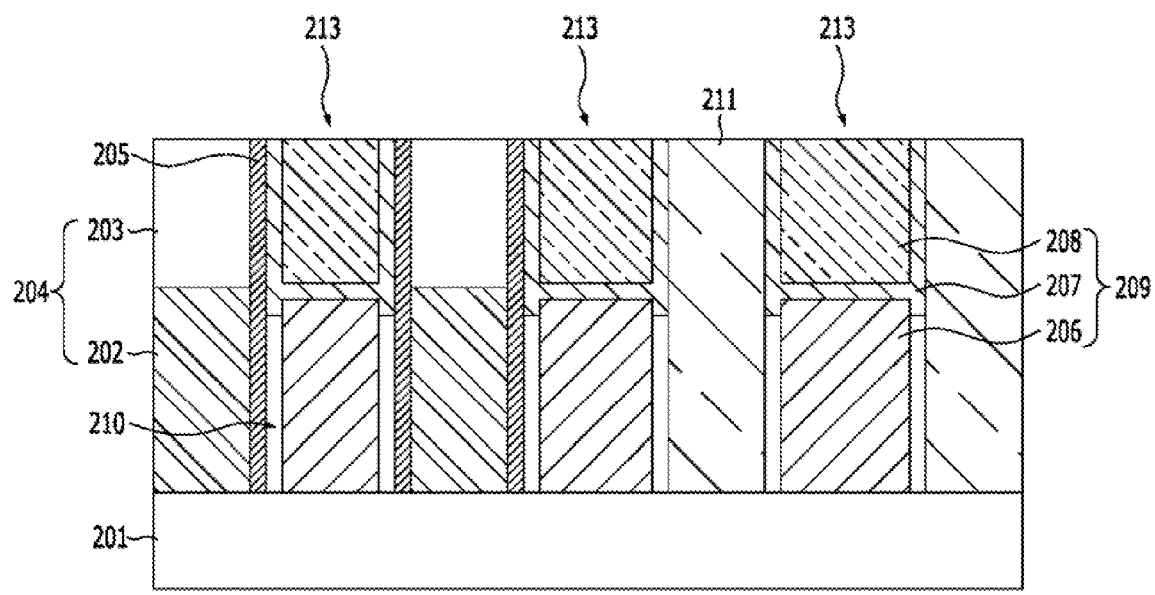
FIG. 6B is a cross-sectional view taken along the line A-A' of FIG. 6A.
Figure 6C:
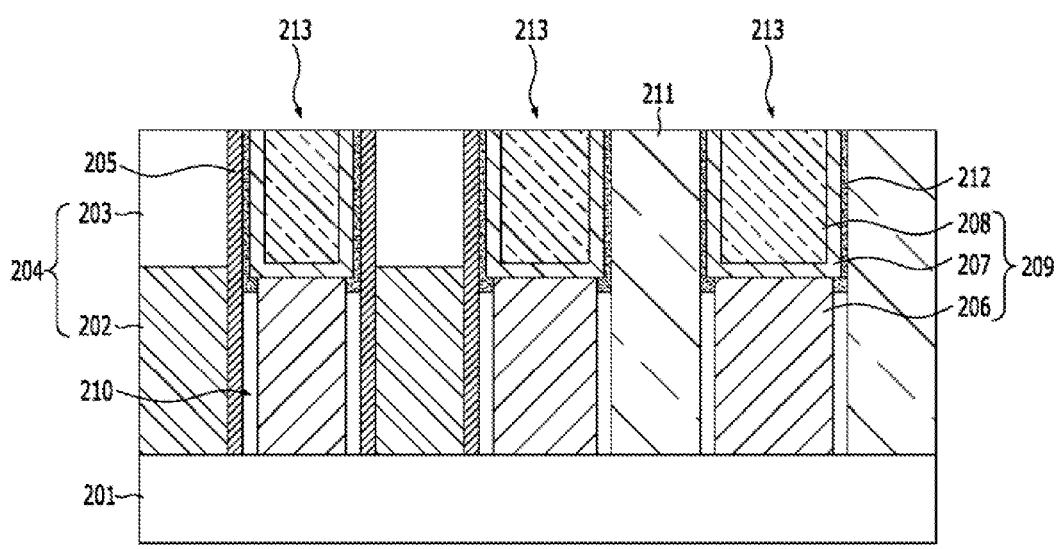
FIG. 6C is a cross-sectional view illustrating a semiconductor device in accordance with a variation of the second exemplary implementation.

FIG. 6A is a plan view illustrating a semiconductor device in accordance with a second exemplary implementation. FIG. 6B is a cross-sectional view taken along the line A-A' of FIG. 6A. FIG. 6C is a cross-sectional view illustrating a semiconductor device in accordance with a variation of the second exemplary implementation.

Referring to FIGS. 6A and 6B, a plurality of conductive structures may be formed on a substrate 201. The conductive structures may include first conductive structures 204 and second conductive structures 209. Isolation structures having air gaps 210 may be formed between the first conductive structures 204 and the second conductive structures 209. The isolation structures may include the air gaps 210 and spacers 205. The spacers 205 may be formed on the sidewalls of the first conductive structures 204. The air gaps 210 may be defined between the spacers 205 and the second conductive structures 209. The first conductive structures 204 may include conductive patterns 202 and isolation patterns 203. The second conductive structures 209 may include first conductive patterns 206, second conductive patterns 207, and third conductive patterns 208. The first conductive patterns 206 and the air gaps 210 may be capped by the second conductive patterns 207.

The first conductive structures 204 may include the conductive patterns 202. The first conductive structures 204 may be stack structures that include the conductive patterns 202 and the isolation patterns 203. The conductive patterns 202 may include a silicon-containing layer or a metal-containing layer. The conductive patterns 202 may include a silicon-containing layer and a metal-containing layer that may be stacked. The conductive patterns 202 may include a polysilicon, a metal, a metal nitride, or a metal silicide. The conductive patterns 202 may include a polysilicon layer and a metal layer that may be stacked. The metal layer may include tungsten. The isolation patterns 203 include a dielectric substance. The dielectric patterns 203 may include an oxide or a nitride. The dielectric patterns 203 may include a silicon nitride. Each of the first conductive structures 204 has a line shape or a pillar shape.

The second conductive structures 209 may include the first conductive patterns 206. The respective first conductive patterns 206 may be formed to be recessed between adjoining first conductive structures 204. The second conductive structures 209 may be stack structures that include the first conductive patterns 206, the second conductive patterns 207 and the third conductive patterns 208. The first conductive patterns 206 may have a height that is the same as or smaller than the conductive patterns 202. Openings 213 may be respectively defined between adjoining first conductive structures 204. The second conductive structures 209 may be formed in the openings 213. An isolation layer 211 may include the openings 213. The isolation layer 211 isolates adjoining second conductive structures 209. The second conductive patterns 207 cover the top surfaces of the first conductive patterns 206. The air gaps 210 may be defined between the first conductive patterns 206 and the conductive patterns 202. The first conductive patterns 206 and the air gaps 210 may be capped by the second conductive patterns 207. The first conductive patterns 206 may include a silicon-containing substance. The first conductive patterns 206 may include a polysilicon. The third conductive patterns 208 may include a metal-containing substance. The third conductive patterns 208 may include tungsten. The second conductive patterns 207 may include a silicide. The second conductive patterns 207 may include a metal silicide. For example, the second conductive patterns 207 may include a titanium silicide, a cobalt silicide, a nickel silicide, or a tungsten silicide. In the present exemplary implementation, the second conductive patterns 207 include a cobalt silicide. The cobalt silicide may include a cobalt silicide with the phase of $CoSi_2$. The second conductive patterns 207 may be a silicide of a silicon-containing layer.

The spacers 205 may be formed on the sidewalls of the first conductive structures 204. The spacers 205 include a low-k substance. The low-k substance may include an oxide or a nitride. The spacers 205 may include a silicon nitride.

The isolation layer 211 may be formed between the first conductive structures 204. The openings 213 may be defined through crossing of the isolation layer 211 and the first conductive structures 204. The isolation layer 211 may include a silicon nitride.

The air gaps 210 may be defined as a sacrificial substance formed between the first conductive patterns 206 and the openings 213 is removed. This will be described later.

Referring to FIG. 6C, unlike FIG. 6B, capping patterns 212 may be additionally included. Each of the capping patterns 212 caps the air gap 210 while exposing the top surface of the first conductive pattern 206. Further, each capping pattern 212 covers the sidewalls of the opening 213 over the air gap 210. The capping pattern 212 may be formed between the second conductive pattern 207 and the sidewalls of the opening 213 and caps the air gap 210. The capping patterns 212 may include a silicon oxide.

The capping efficiency of the air gaps 210 may be increased by the capping patterns 212.

The second conductive structure 209 according to the second exemplary implementation and the variation thereof may be a plug structure. The second conductive structure 209 may be a plug that connects a transistor and a memory element. The second conductive structure 209 may be a plug that connects a transistor and a metal line. The first conductive pattern 206 becomes a silicon plug, and the third conductive pattern 208 becomes a metal plug. The second conductive pattern 207 may be an ohmic contact layer between the silicon plug and the metal plug.

The first conductive structure 204 may become a wiring layer. The wiring layer may include a bit line, a metal line, a gate electrode, a word line, a through electrode, or a pillar type channel.

While not shown, another conductive structure may be additionally formed on the second conductive structure 209. Another conductive structure may be a part of a memory element that is electrically connected to the second conductive structure 209. The memory element may include a capacitor that may include a storage node, a dielectric layer, or a plate node, and another conductive structure may include the storage node. The memory element may be realized in a variety of ways. For example, the memory element may include a resistance variable substance. The memory element may include a first electrode, a resistance variable substance and a second electrode that may be sequentially stacked, and the first electrode may be electrically connected to the second conductive structure 209. Information may be stored due to the fact that the resistance of the resistance variable substance is changed according to the voltages applied to the first electrode and the second electrode. The resistance variable substance may include a phase change substance or a magnetic tunnel junction.

While not shown, a transistor that may include a gate electrode, a source region and a drain region may be additionally formed. The second conductive structure 209 may be connected to the source region or the drain region of the transistor. The transistor may include a planar gate type transistor, a trench gate type transistor, a buried gate type transistor, a recess gate type transistor, or a vertical channel transistor.

FIGS. 7A to 7H are views showing an exemplary method of fabricating the semiconductor device in accordance with the second exemplary implementation. FIGS. 7A to 7H are cross-sectional views taken along the line A-A' of FIG. 6A.

Figure 7A:
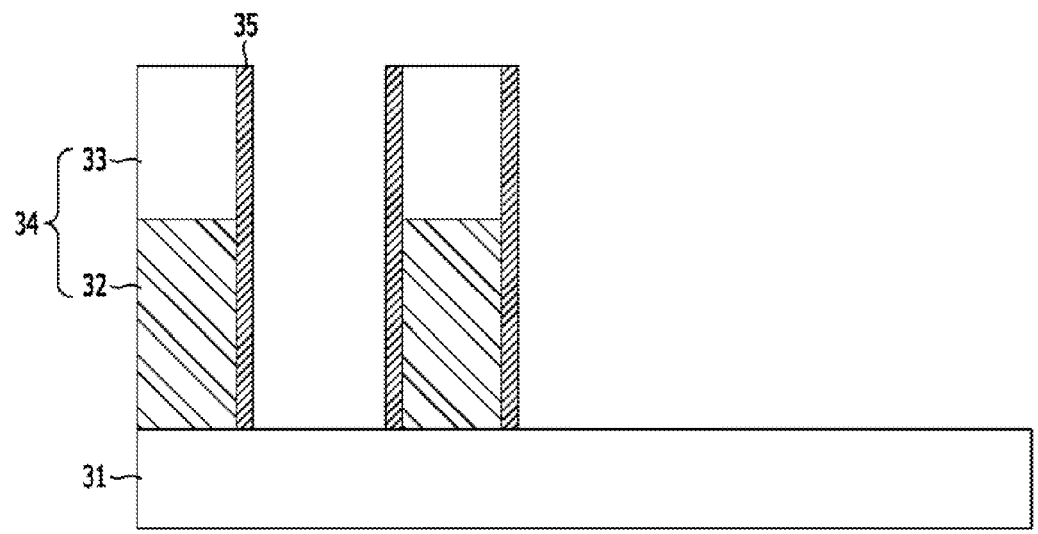
FIGS. 7A to 7H are views showing an exemplary method of fabricating the semiconductor device in accordance with the second exemplary implementation.

Referring to FIG. 7A, a plurality of first conductive structures 34 may be formed on a substrate 31. The plurality of first conductive structures 34 may be arranged at regular intervals. The first conductive structures 34 may be line type structures. In order to form the first conductive structures 34, hard mask patterns 33 may be formed on a first conductive layer (not shown). By etching the first conductive layer using the hard mask patterns 33 as etch masks, conductive patterns 32 may be formed. The first conductive structures 34, in which the conductive patterns 32 and the hard mask patterns 33 may be stacked, may be formed. The conductive patterns 32 include a silicon-containing layer or a metal-containing layer. For example, the conductive patterns 32 may include a polysilicon or tungsten. Further, the conductive patterns 32 may be formed by stacking a silicon-containing layer and a metal-containing layer. For example, the conductive patterns 32 may be formed by stacking a polysilicon layer and a tungsten layer. A barrier layer may be additionally formed between the polysilicon layer and the tungsten layer. The conductive patterns 32 may include a stack structure of a polysilicon layer, a titanium-containing layer and a tungsten layer. The titanium-containing layer, which serves as a barrier layer, may be formed by stacking titanium (Ti) and a titanium nitride (TiN). The hard mask patterns 33 may include a dielectric substance. The hard mask patterns 33 may include a silicon nitride.

While not shown, a dielectric substance may be additionally formed over the substrate 31 under the first conductive structures 34.

Protective spacers 35 may be formed on the sidewalls of the plurality of first conductive structures 34. The protective spacers 35 may include a low-k substance. The protective spacers 35 may include a nitride or an oxide. For example, the protective spacers 35 may include a silicon nitride or a silicon oxide. The protective spacers 35 may be formed through deposition and etching of a protective layer (not shown). The protective spacers 35 substantially prevent the conductive patterns 32 of the first conductive structures 34 from being attacked in a subsequent process. The protective spacers 35 and the hard mask patterns 33 may include a silicon nitride.

Figure 7B:
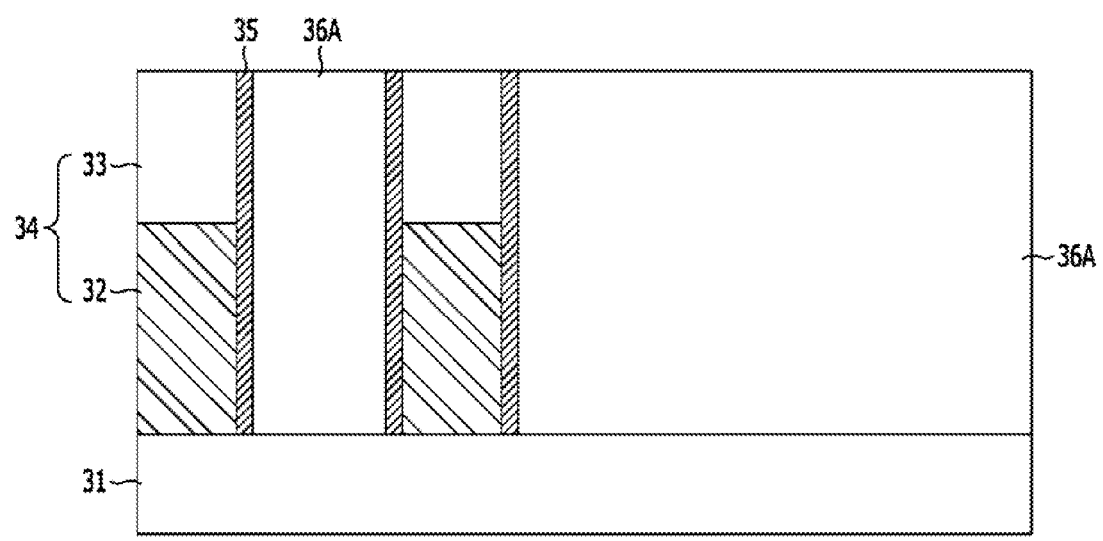

Referring to FIG. 7B, a sacrificial layer 36A may be formed. The sacrificial layer 36A may include a dielectric layer. The sacrificial layer 36A may include a silicon oxide. After the sacrificial layer 36A is formed to fill the spaces between the first conductive structures 34, the sacrificial layer 36A may be planarized such that the top surfaces of the first conductive structures 34 may be exposed.

Figure 7C:
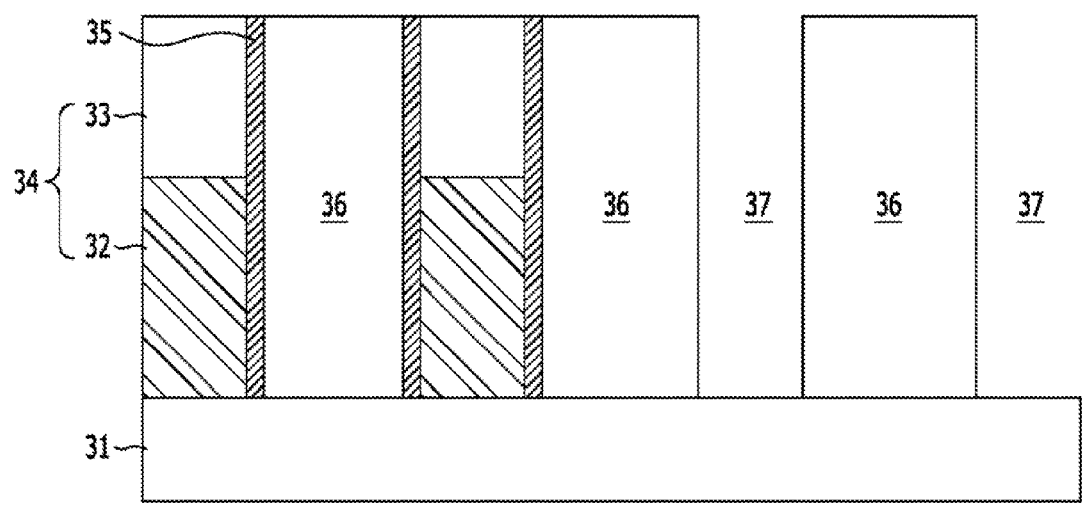

Referring to FIG. 7C, sacrificial patterns 36 may be formed. The sacrificial patterns 36 may be formed through etching of the sacrificial layer 36A. The sacrificial layer 36A may be etched using mask patterns (not shown) as etch masks. Accordingly, the sacrificial patterns 36 may be formed between the first conductive structures 34, and a structure, in which the sacrificial patterns 36 and the first conductive structures 34 cross each other, is formed. Pre-isolation parts 37 may be defined between the sacrificial patterns 36.

Figure 7D:
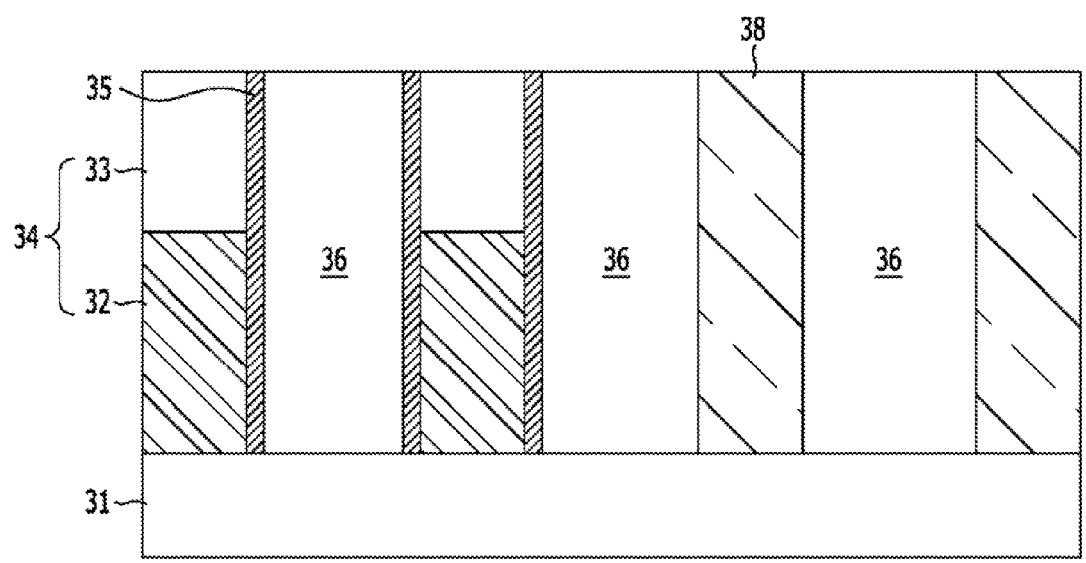

Referring to FIG. 7D, an isolation layer 38 may be formed in the pre-isolation parts 37. The isolation layer 38 may include a dielectric layer. The isolation layer 38 may include a silicon nitride. The isolation layer 38 has a shape that crosses with the first conductive structures 34. After the isolation layer 38 is formed on the entire surface to fill the pre-isolation parts 37, the isolation layer 38 may be planarized such that the surfaces of the sacrificial patterns 36 may be exposed.

Figure 7E:
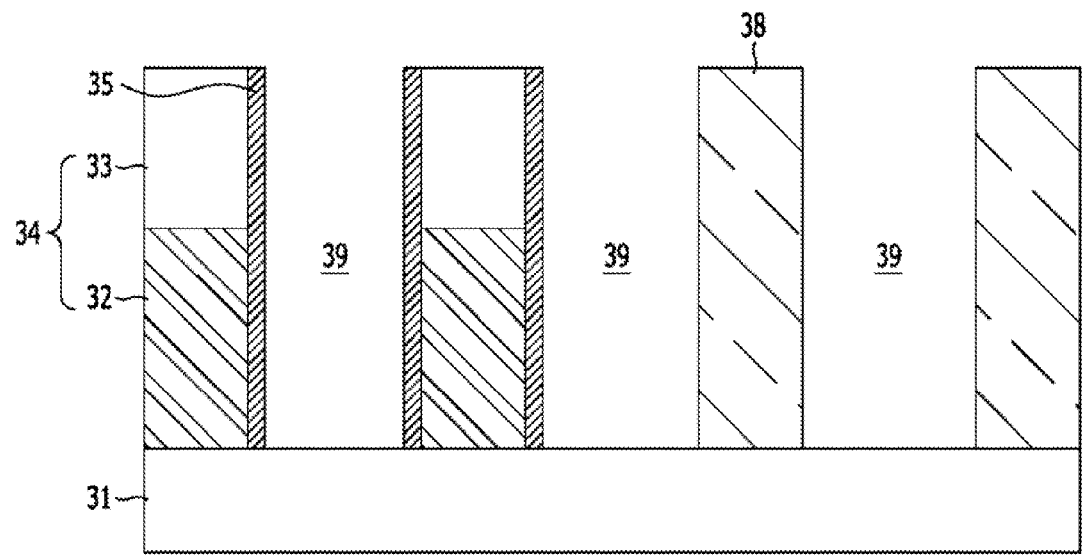

Referring to FIG. 7E, the sacrificial patterns 36 may be removed. According to this fact, openings 39 may be defined. The sacrificial patterns 36 may be removed through wet etching. As the sacrificial patterns 36 may be removed, the isolation layer 38 remains. The openings 39 may be defined through crossing of the first conductive structures 34 and the isolation layer 38. The series of processes of forming the sacrificial layer 36A, the sacrificial patterns 36, the isolation layer 38 and the openings 39 may be collectively referred to as a damascene process.

The isolation layer 38, including the openings 39, may be formed between the first conductive structures 34. The plurality of openings 39 may be defined at regular intervals to form an opening array. The surface of the substrate 31 is exposed by the openings 39.

Figure 7F:
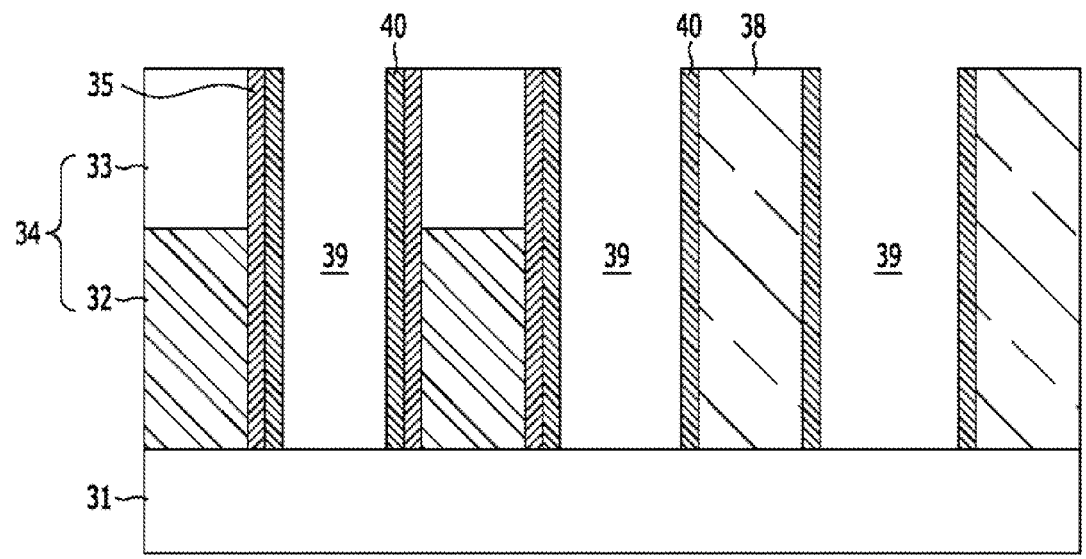

Referring to FIG. 7F, sacrificial spacers 40 may be formed. The sacrificial spacers 40 may be formed on the sidewalls of the openings 39. Accordingly, the sacrificial spacers 40 may be formed on not only the sidewalls of the openings 39 but also the sidewalls of the protective spacers 35. In order to form the sacrificial spacers 40, processes of depositing and etching-back a sacrificial layer may be performed. The sacrificial spacers 40 include a substance that is removed by wet etching. The sacrificial spacers 40 may include a substance that has an etching selectivity to the isolation layer 38. For example, when wet-etching the sacrificial spacers 40, the isolation layer 38 is not etched and remains. The sacrificial spacers 40 may include a silicon oxide. The sacrificial spacers 40 may include an ultra low temperature oxide (ULTO).

Figure 7G:
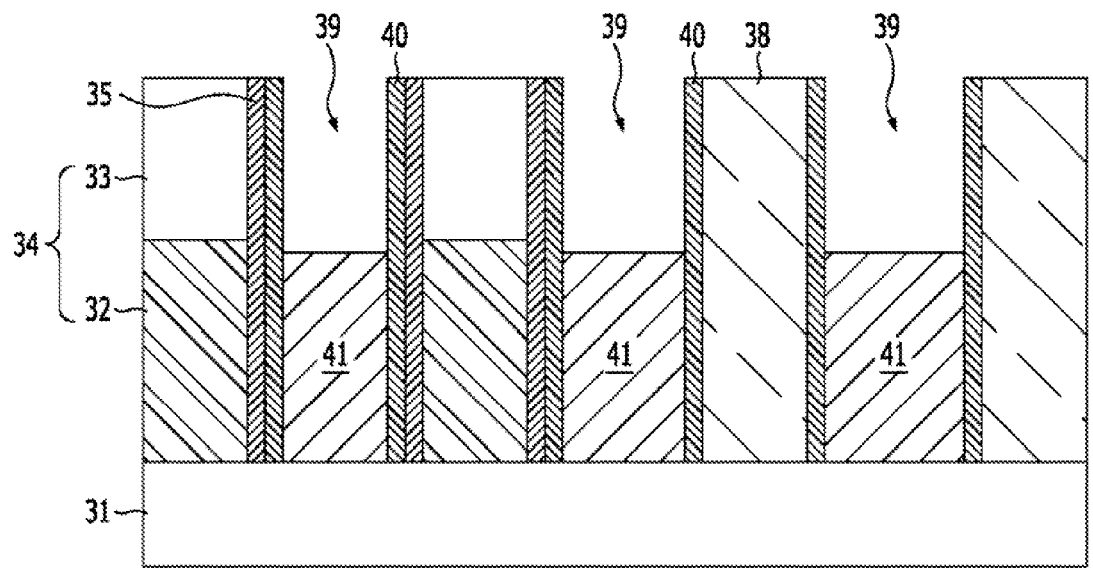

Referring to FIG. 7G, first conductive patterns 41 may be formed. The first conductive patterns 41 may be formed to be recessed in the openings 39. A second conductive layer (not shown) is formed on the isolation layer 38 in such a way as to fill the openings 39. By selectively removing the second conductive layer, the first conductive patterns 41 may be formed in the openings 39. In order to form the first conductive patterns 41, an etch-back process for the second conductive layer may be performed. The first conductive patterns 41 may include a silicon-containing layer. The first conductive patterns 41 may include a polysilicon. An impurity may be doped into the polysilicon. The first conductive patterns 41 may have a height that is recessed to be lower than the top surfaces of the isolation layer 38 and the first conductive structures 34. Portions of the sacrificial spacers 40 may be exposed by the first conductive patterns 41.

Figure 7H:
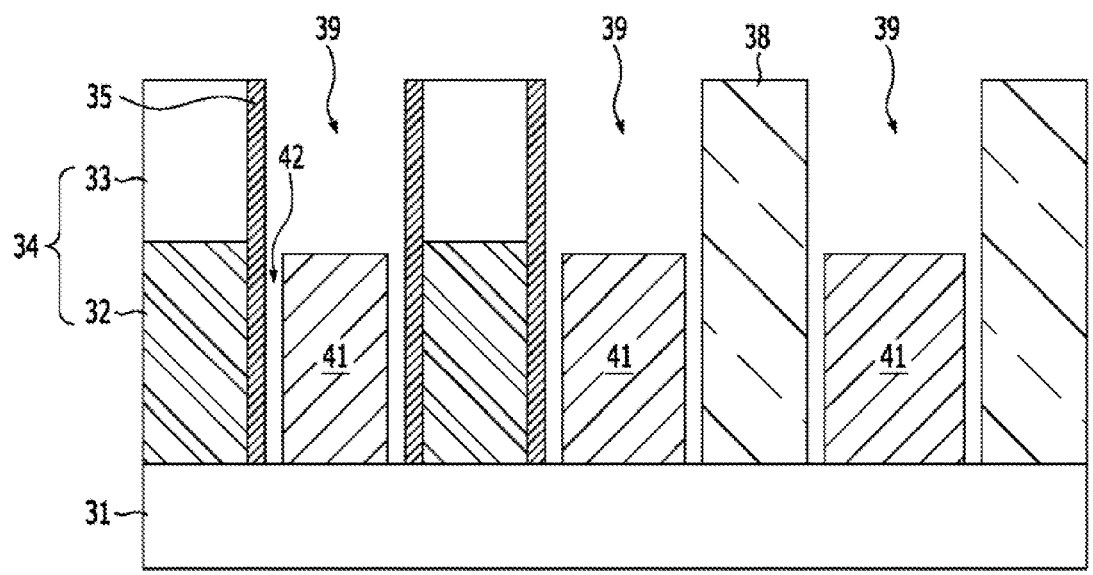

Referring to FIG. 7H, the sacrificial spacers 40 may be removed. In order to remove the sacrificial spacers 40, a strip process is performed. The strip process may include a cleaning process. The cleaning process uses a wet chemical capable of removing the sacrificial spacers 40. As the sacrificial spacers 40 may be removed by the strip process, the spaces having been occupied by the sacrificial spacers 40 remain as air gaps 42.

The air gaps 42 may be defined between the first conductive patterns 41 and the sidewalls of the openings 39. Each of the air gaps 42 has a shape that surrounds the sides of the first conductive pattern 41. Isolation structures formed by the air gaps 42 may be formed between the isolation layer 38 and the first conductive patterns 41. Isolation structures including the protective spacers 35 and the air gaps 42 may be formed between the first conductive structures 34 and the first conductive patterns 41.

Figure 8:
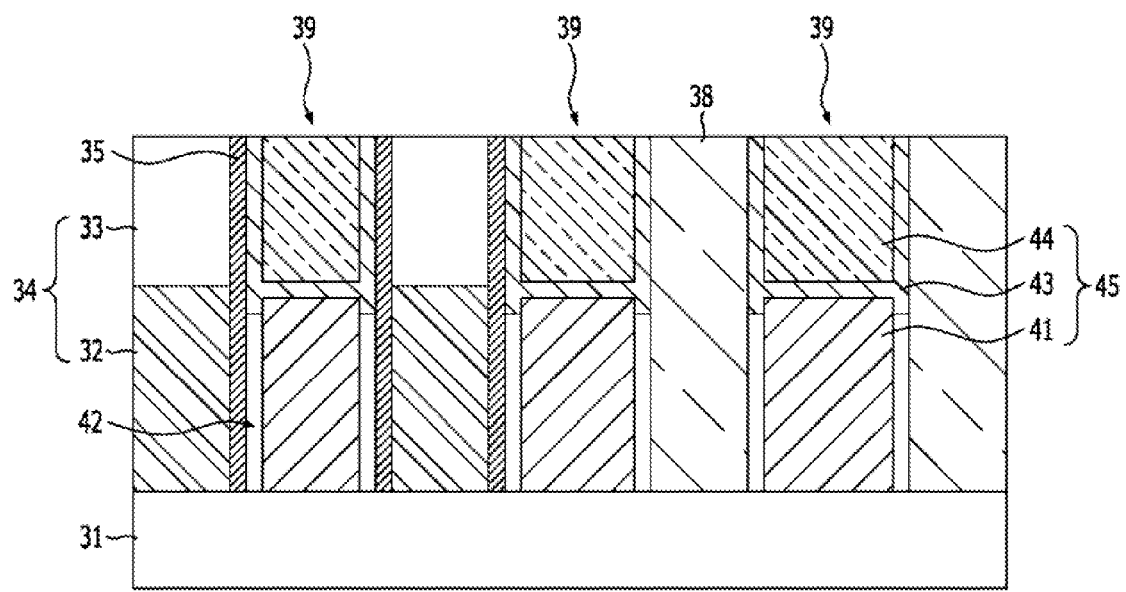
FIG. 8 is a view showing an exemplary method of capping air gaps in the semiconductor device in accordance with the second exemplary implementation.

FIG. 8 is a view showing an exemplary method of capping air gaps in the semiconductor device in accordance with the second exemplary implementation.

Referring to FIG. 8, second conductive patterns 43 may be formed. The air gaps 42 and the first conductive patterns 41 may be capped by the second conductive patterns 43. The second conductive patterns 43 cover the top end parts of the first conductive patterns 41 while capping the air gaps 42. The second conductive patterns 43 may be formed by applying the method according to the first exemplary implementation. That is to say, the second conductive patterns 43 may be formed through deposition of a liner layer and silicidation of the liner layer.

Third conductive patterns 44 may be formed on the second conductive patterns 43. Each of the third conductive patterns 44 has a shape that fills the remaining portion of the opening 39 on the second conductive pattern 43. The third conductive patterns 44 may include a metal-containing layer. The third conductive patterns 44 may include a tungsten layer.

As the third conductive patterns 44 may be formed in this way, second conductive structures 45 may be formed in the openings 39. The second conductive structures 45 may include the first conductive patterns 41, the second conductive patterns 43 and the third conductive patterns 44. The second conductive patterns 43 form ohmic contacts between the first conductive patterns 41 and the third conductive patterns 44. The air gaps 42 may be defined between the first conductive patterns 41 and the sidewalls of the openings 39. Isolation structures, including the air gaps 42 and the protective spacers 35, may be formed between the second conductive structures 45 and the first conductive structures 34.

Figure 9:
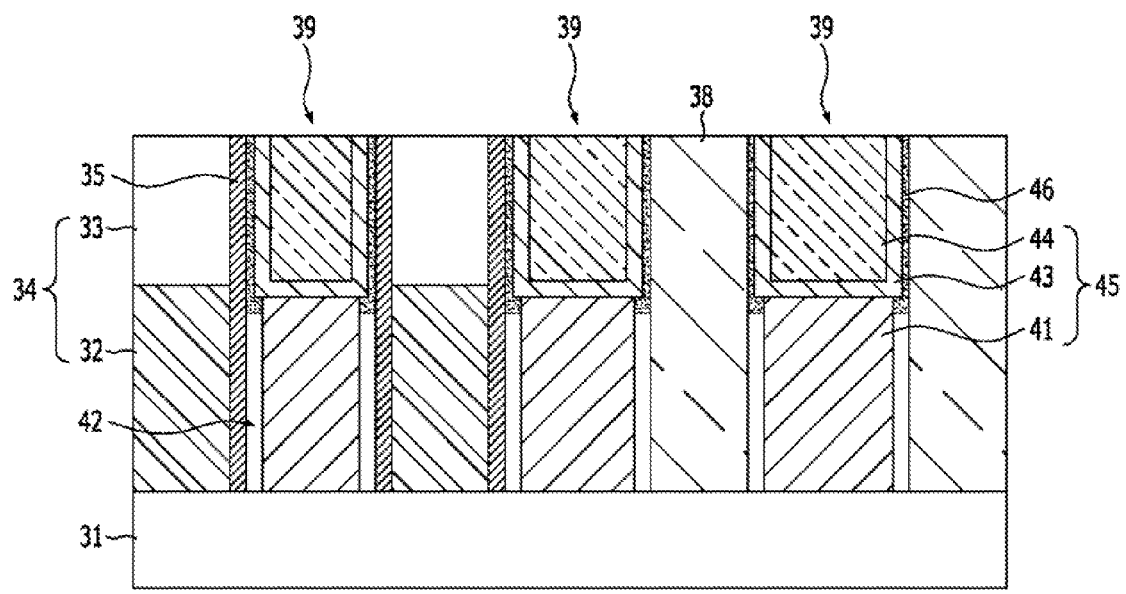
FIG. 9 is a view showing another exemplary method of capping air gaps in the semiconductor device in accordance with the second exemplary implementation.

FIG. 9 is a view showing another exemplary method of capping air gaps in the semiconductor device in accordance with the second exemplary implementation.

Referring to FIG. 9, capping patterns 46, which cap the air gaps 42, may be additionally included. The capping patterns 46 cap the air gaps 42 in cooperation with the second conductive patterns 43. The capping patterns 46 may be formed by applying the method according to the first exemplary implementation. The capping patterns 46 may be formed between the second conductive patterns 43 and the sidewalls of the openings 39 and cap the air gaps 42. The capping patterns 46 may include a silicon oxide.

The capping efficiency of the air gaps 42 may be increased by the capping patterns 46.

By the above-described capping methods, the air gaps 42 may be stably capped.

According to the second exemplary implementation and the variation thereof, since the air gaps 42 may be defined, the parasitic capacitance between the first conductive structures 34 and the second conductive structures 45 may be reduced.

Further, since the second conductive patterns 43 may include a silicide layer, the sheet resistance (Rs) of the second conductive structures 45 may be reduced. In particular, since the second conductive patterns 43 may include a low resistance silicide layer, the sheet resistance (Rs) of the second conductive structures 45 may be further reduced. If the sheet resistance (Rs) is reduced, contact resistance (Rc) may be improved.

Moreover, since the contact may be a between the first conductive pattern 41 and the second conductive pattern 43 increases, the contact resistance of the second conductive structures 45 may be further improved.

Furthermore, the air gaps 42 may be stably capped using the second conductive patterns 43 and the capping patterns 46.

Figure 10A:
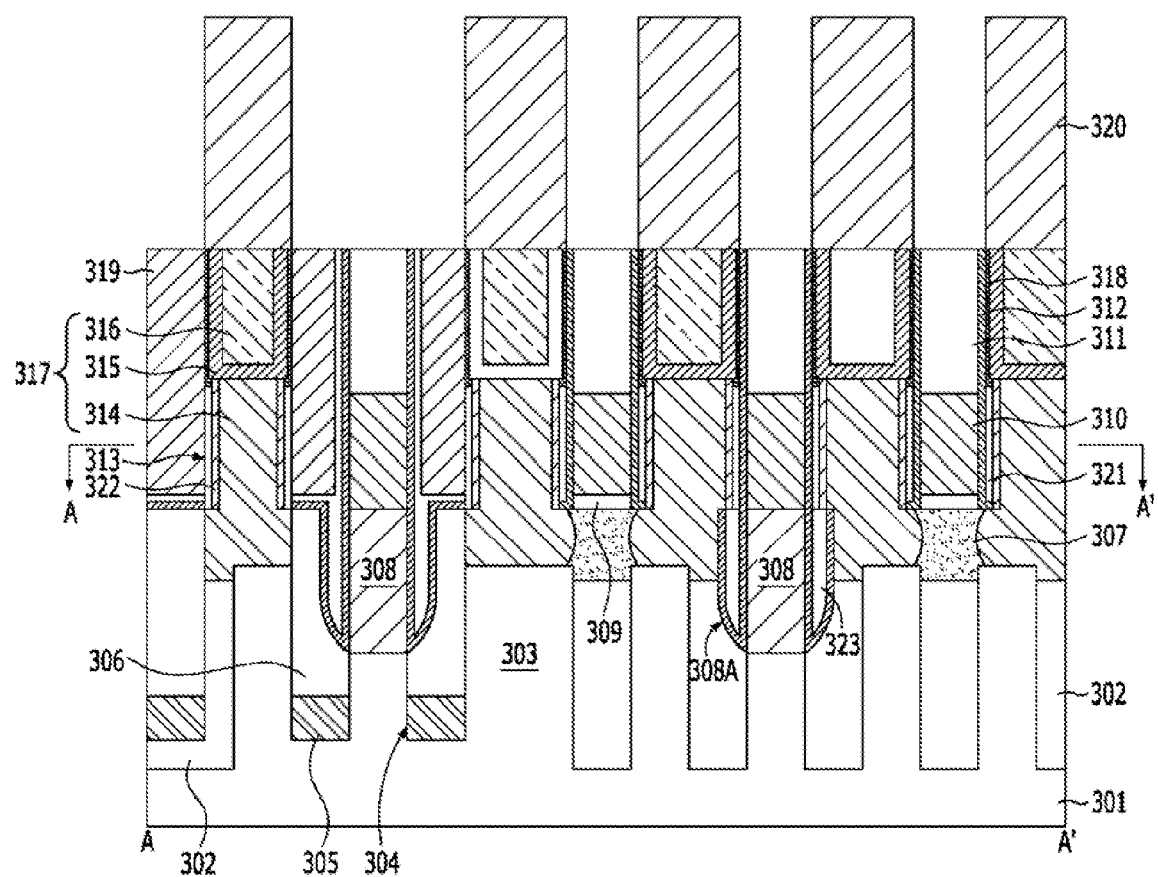
FIG. 10A is a view illustrating portions of memory cells.
Figure 10B:
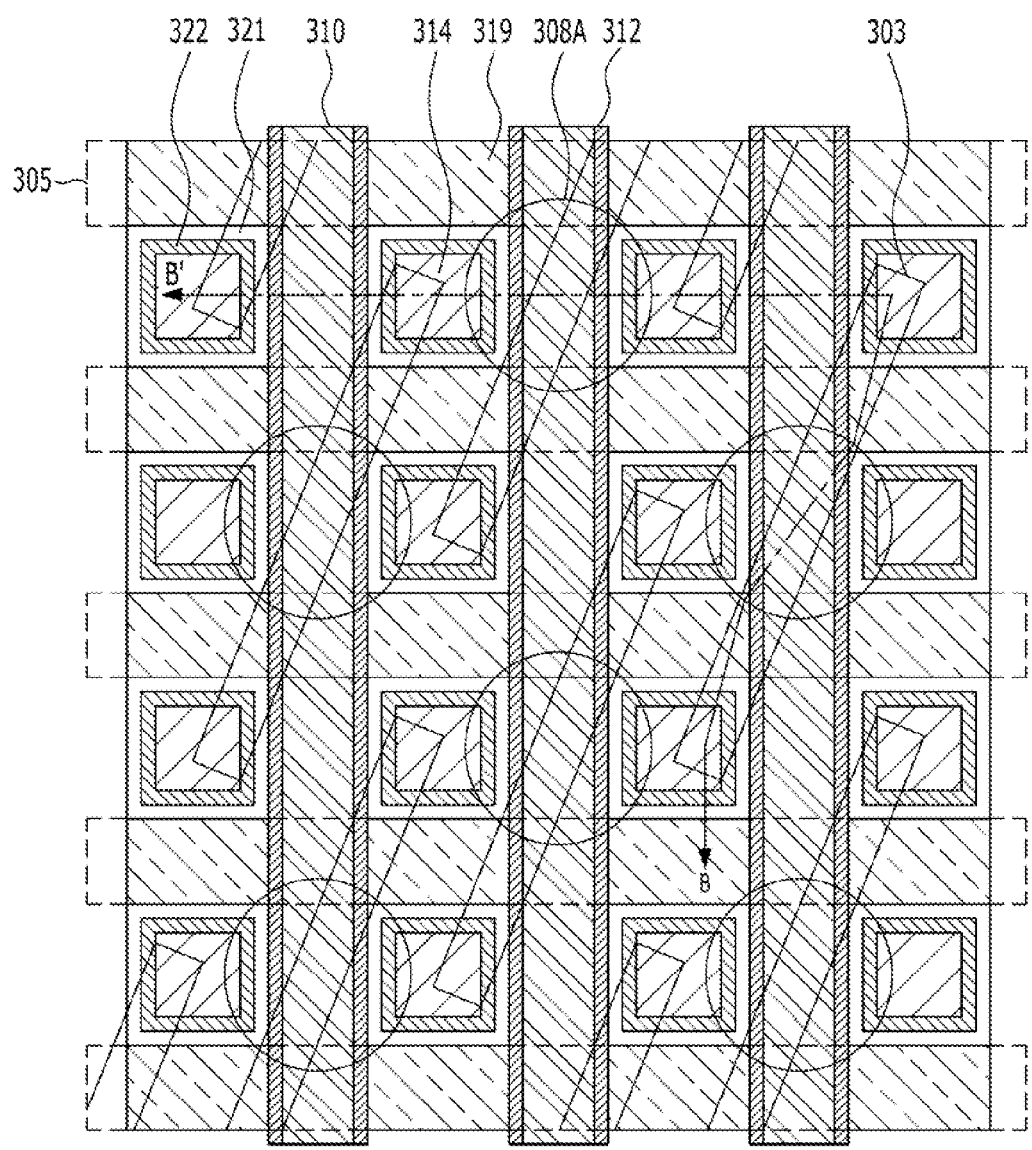
FIG. 10B is a plan view taken along the line A-A' of FIG. 10A.

FIG. 10A is a view illustrating portions of memory cells. FIG. 10B is a plan view taken along the line A-A' of FIG. 10A. The memory cells shown in FIG. 10A include memory cells of a DRAM.

Referring to FIGS. 10A and 10B, an isolation region 302 may be formed in a substrate 301. Active regions 303 may be defined by the isolation region 302. Gate trenches 304 may be defined to extend across the active regions 303. A gate dielectric layer (not shown) may be formed on the surfaces of the gate trenches 304. Buried gate electrodes 305 may be formed on the gate dielectric layer in such a way as to partially fill the gate trenches 304. While not shown, source regions and drain regions may be formed in the substrate 301. A sealing layer 306 may be formed on the buried gate electrodes 305. Bit line structures, including bit lines 310 that extend in a direction crossing with the buried gate electrodes 305, may be formed.

Each of the bit line structures may include a bit line contact plug 308, the bit line 310, and a bit line hard mask 311. The bit line 310 may be connected with the active region 303 through the bit line contact plug 308. The bit line contact plug 308 may be formed in a bit line contact hole 308A, which is defined in a dielectric layer 307 and the sealing layer 306. First spacers 312 may be formed on the sidewalls of the bit line structures. Contact spacers 323 may be formed around bit line contact plugs 308. The contact spacers 323 may be also formed between the bit line structures and an isolation layer 319. The bit line contact plug 308 may have a line width smaller than the diameter of the bit line contact hole 308A.

Storage node contact plugs 317 may be formed to be connected with the active regions 303. The storage node contact plugs 317 may be formed in storage node contact holes 313 which may be defined in the isolation layer 319. Each of the storage node contact plugs 317 may include a first plug 314, an ohmic contact layer 315, and a second plug 316. The first plug 314 is a silicon plug that may include a polysilicon. The second plug 316 is a metal plug that may include tungsten. The ohmic contact layer 315 covers the top surface of the first plug 314. The ohmic contact layer 315 is a silicide of a polysilicon layer. Second spacers 322 may be formed on the sidewalls of the first plug 314. An air gap 321 has a shape that surrounds the sidewalls of the first plug 314.

Isolation structures, including the first spacers 312, air gaps 321 and the second spacers 322, may be formed between the storage node contact plugs 317 and the bit lines 310. The first spacers 312, the air gaps 321 and the second spacers 322 may be NAN (nitride-air-nitride) structures. The air gaps 321 may be capped by capping patterns 318 and the ohmic contact layer 315. For methods of forming the storage node contact plugs 317, the air gaps 321 and the capping patterns 318, reference may be made to the above-described exemplary implementations.

Memory elements may be formed on the storage node contact plugs 317. The memory elements include capacitors that include storage nodes 320. Each of the storage nodes 320 has a pillar shape. While not shown, a dielectric layer and plate nodes may be additionally formed on the storage nodes 320. Each of the storage nodes 320 may have a cylinder shape instead of the pillar shape.

As may be readily seen, a memory cell may include a buried gate type transistor including the buried gate electrode 305, the bit line 310, the storage node contact plug 317, and the memory element. The air gap 321 may be defined between the storage node contact plug 317 and the bit line 310. Accordingly, the parasitic capacitance between the bit line 310 and the storage node contact plug 317 may be reduced.

While not shown, in a variation of the memory cell, the air gap 321 may be capped by the ohmic contact layer 315 without using the capping patterns 318. In this regard, reference may be made to the air gap capping methods of the first exemplary implementation and the second exemplary implementation.

Figure 11A:
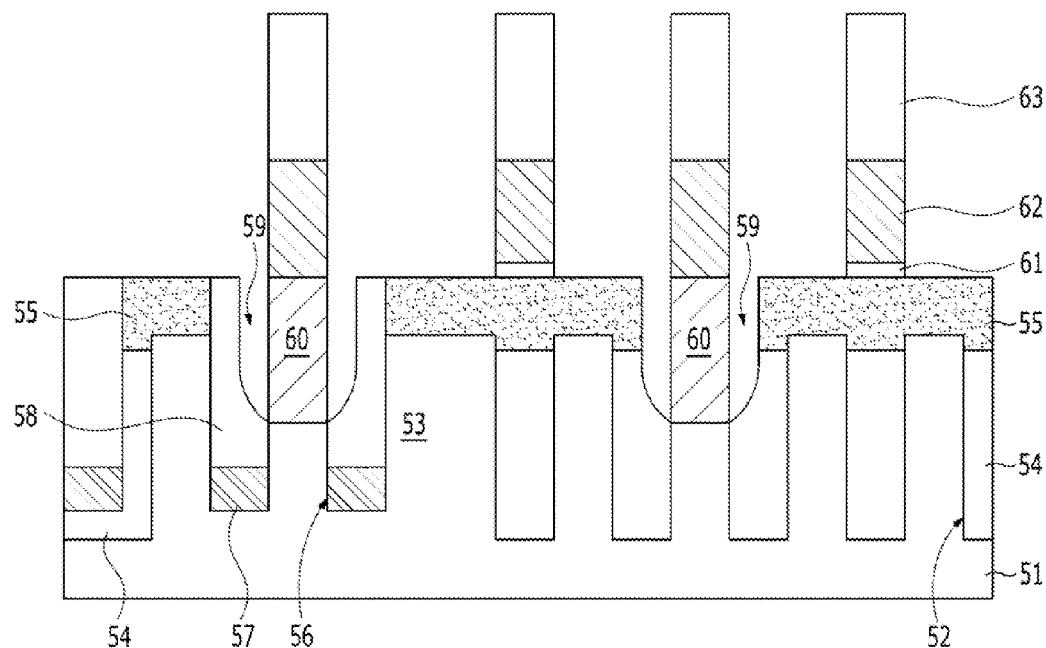
FIGS. 11A to 11O are views showing an exemplary method of fabricating memory cells.
Figure 11B:
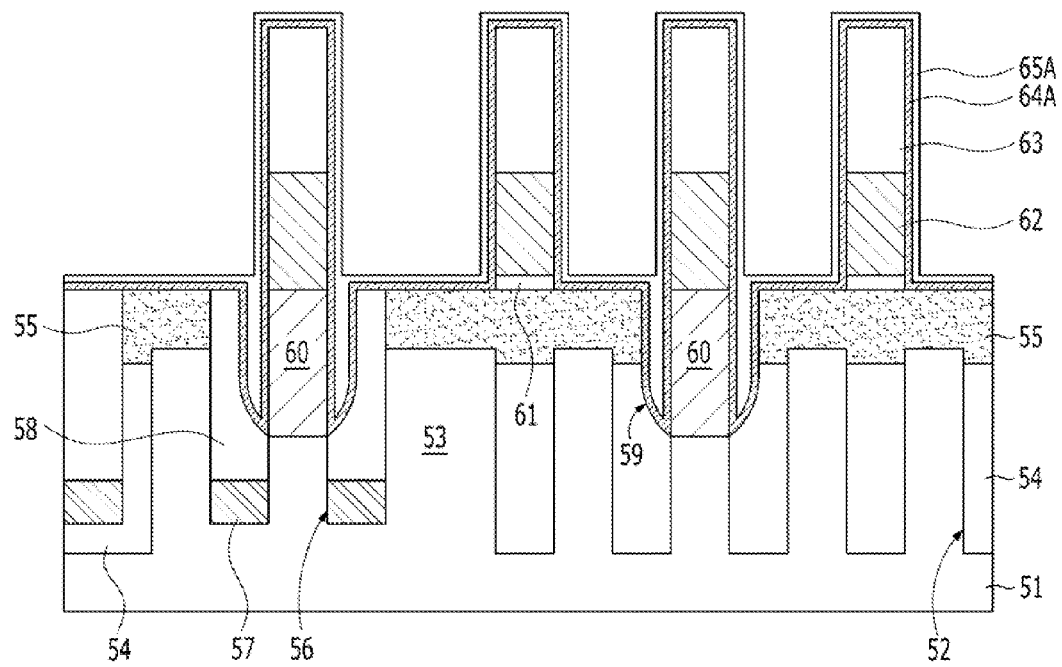
Figure 11C:
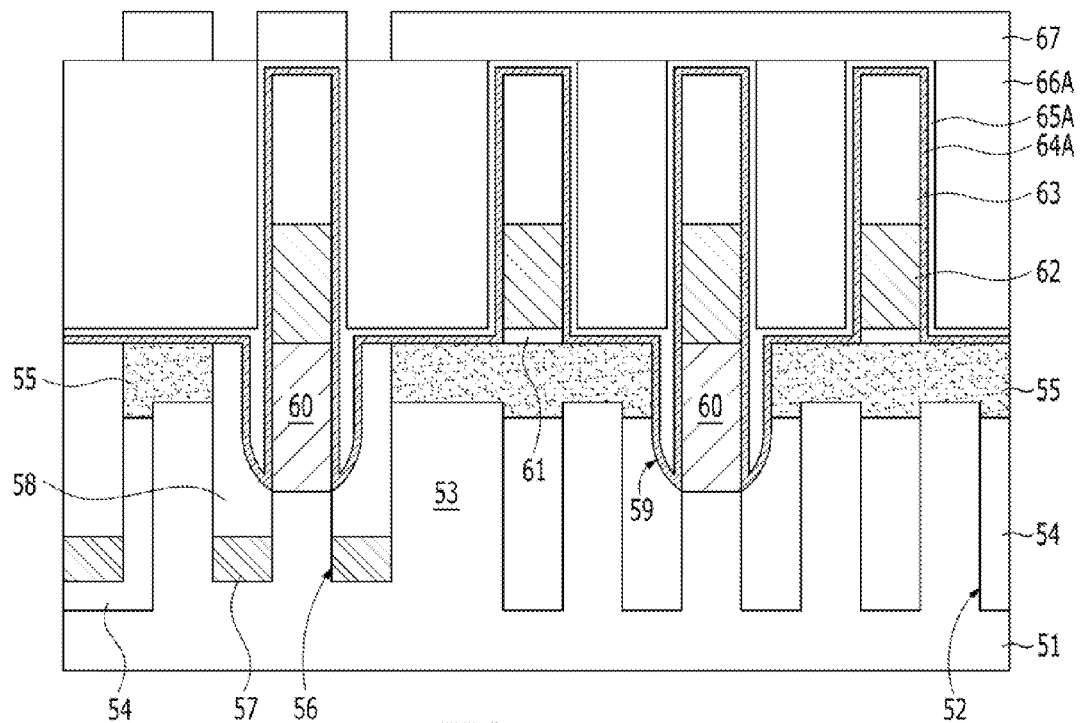
Figure 11D:
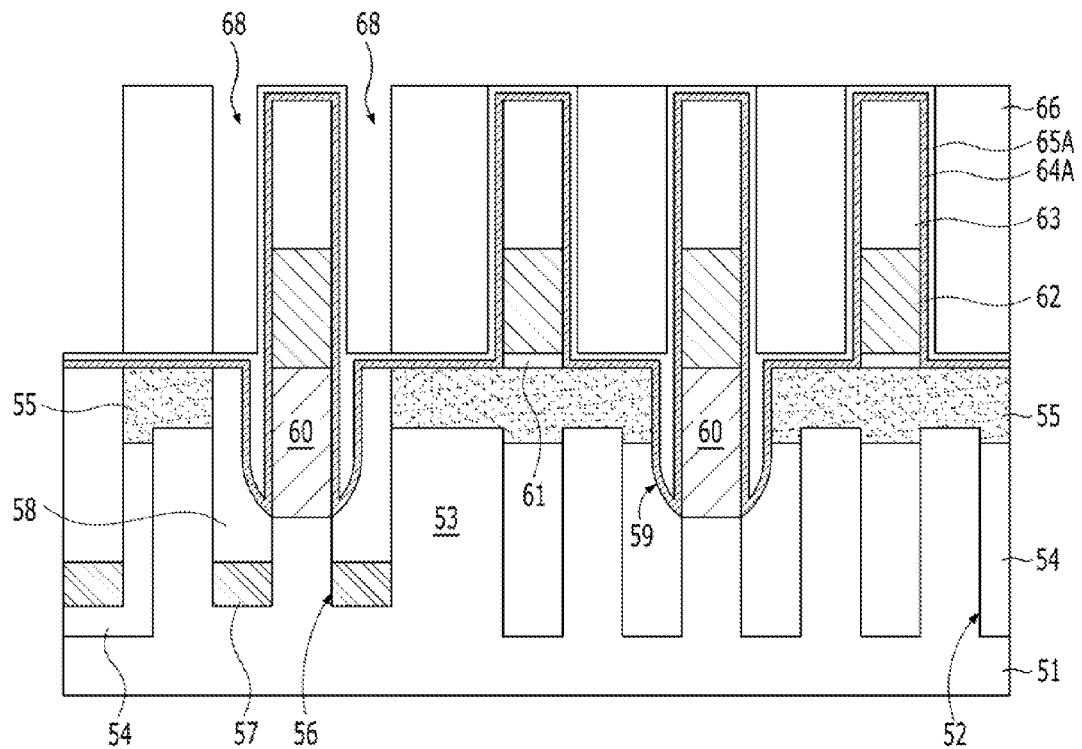
Figure 11E:
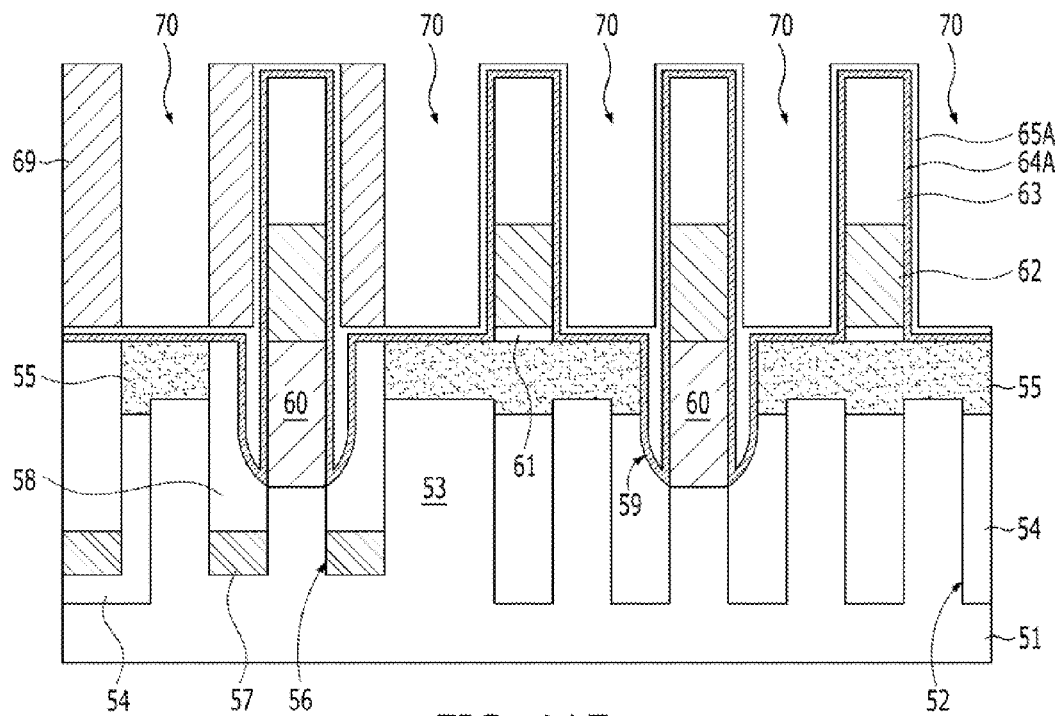
Figure 11F:
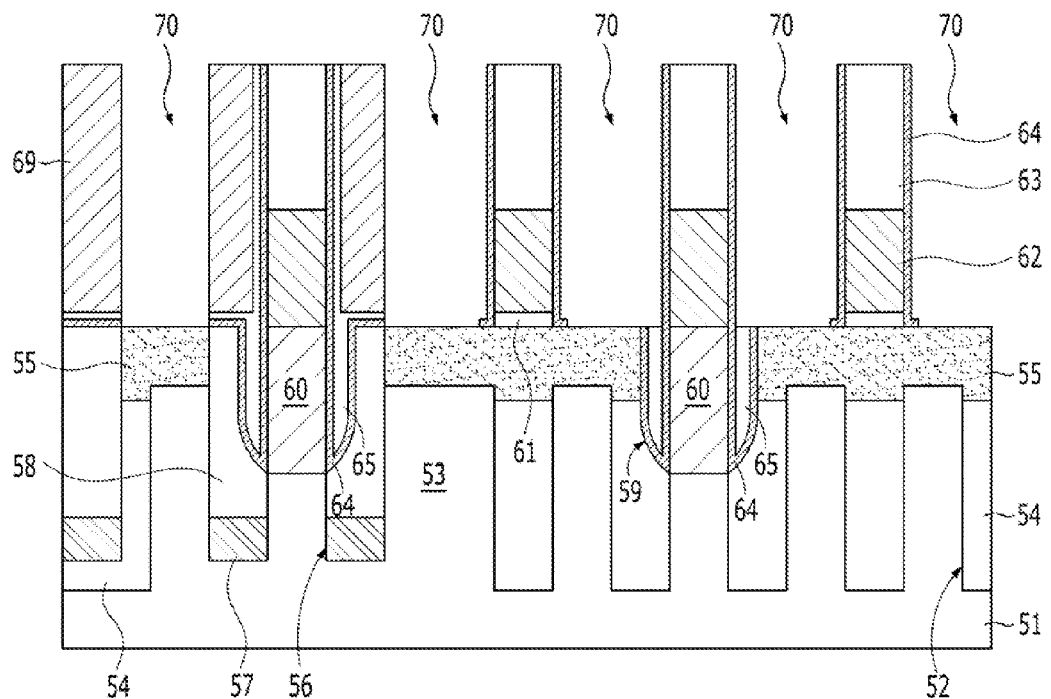
Figure 11G:
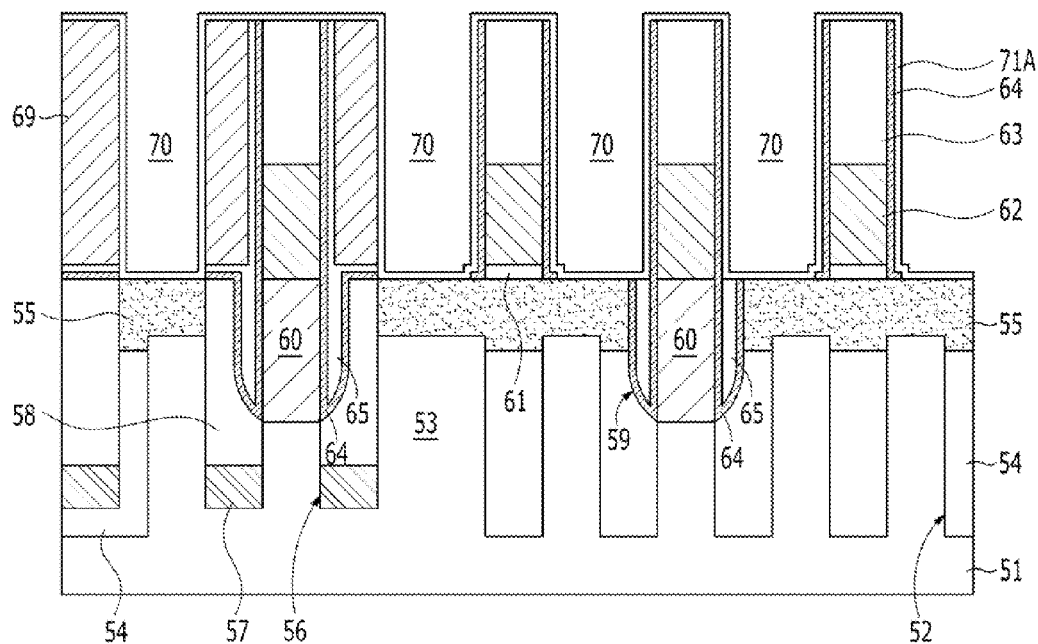
Figure 11H:
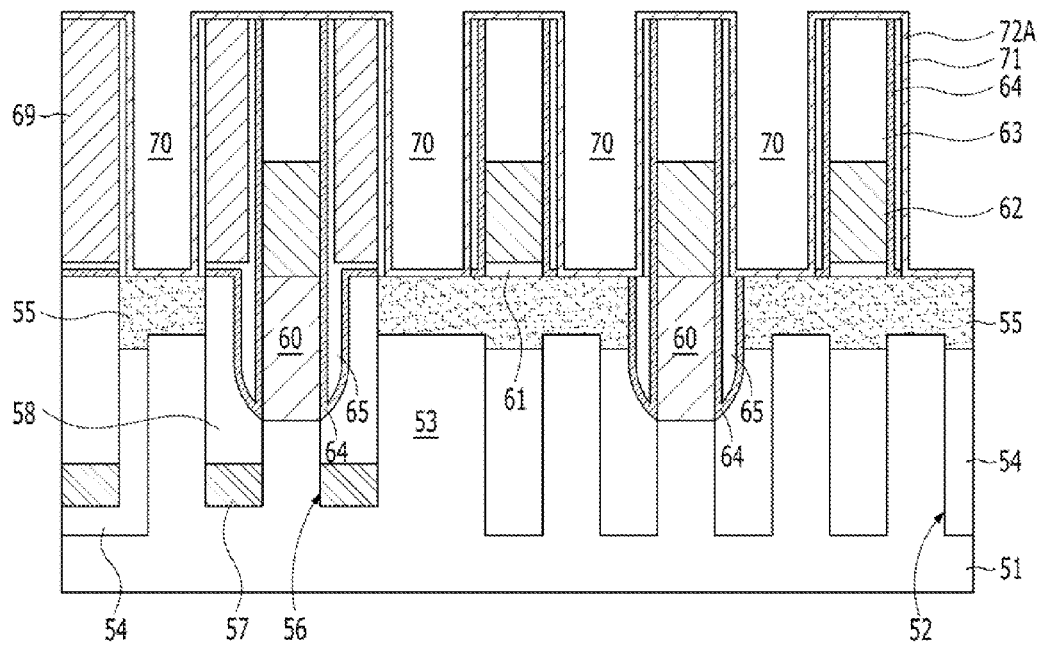
Figure 11I:
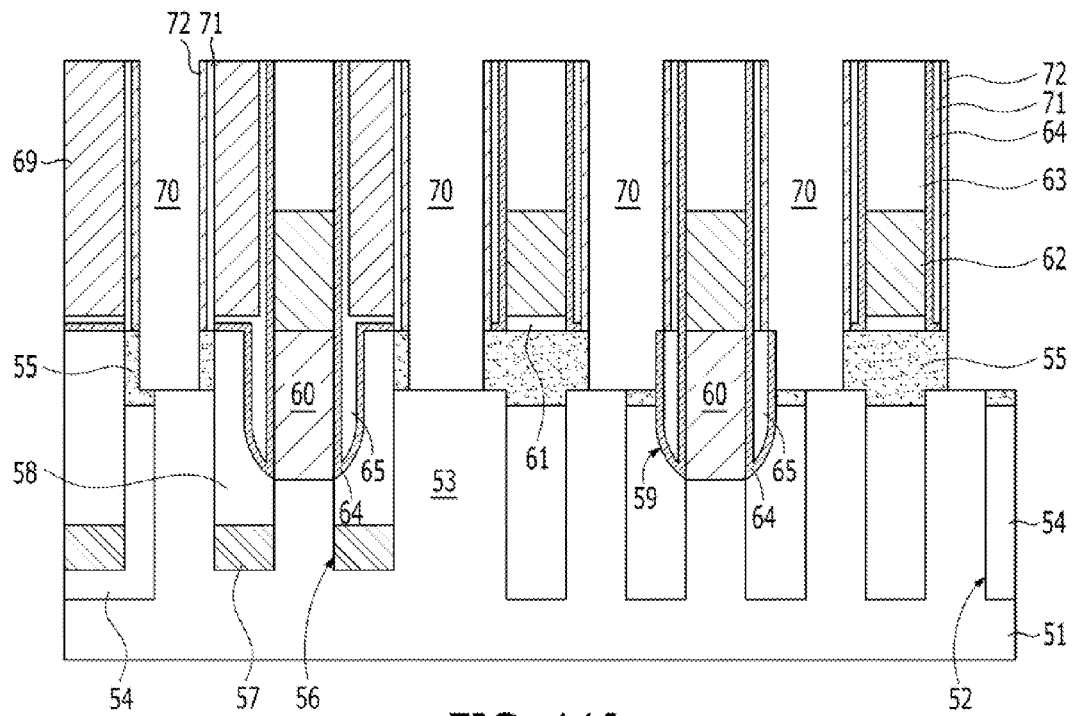
Figure 11J:
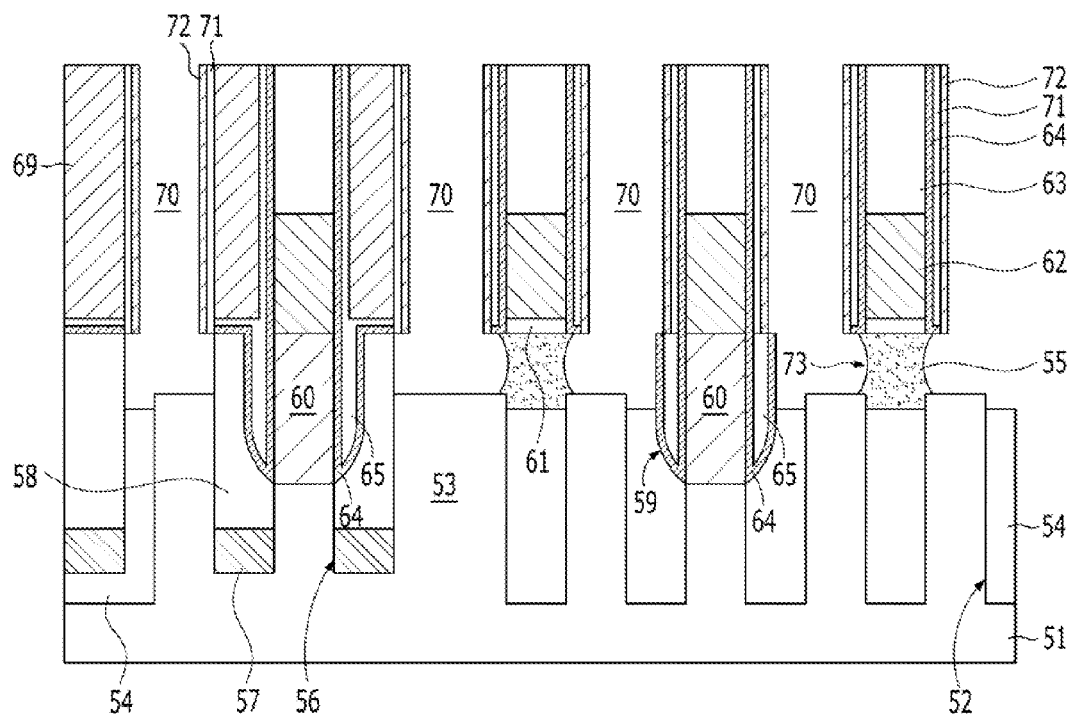
Figure 11K:
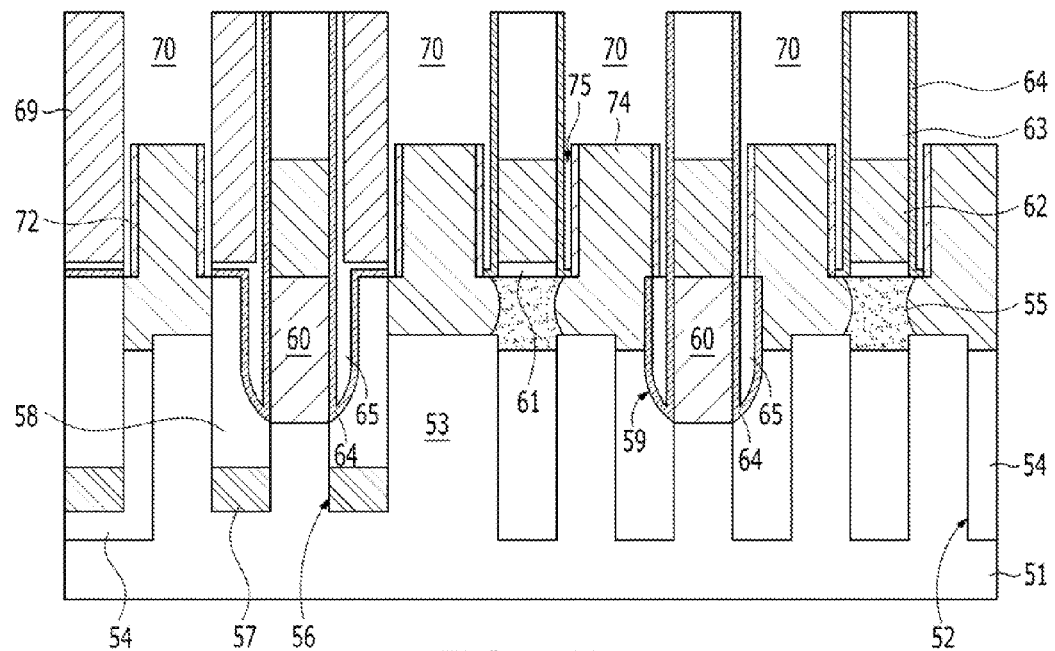
Figure 11L:
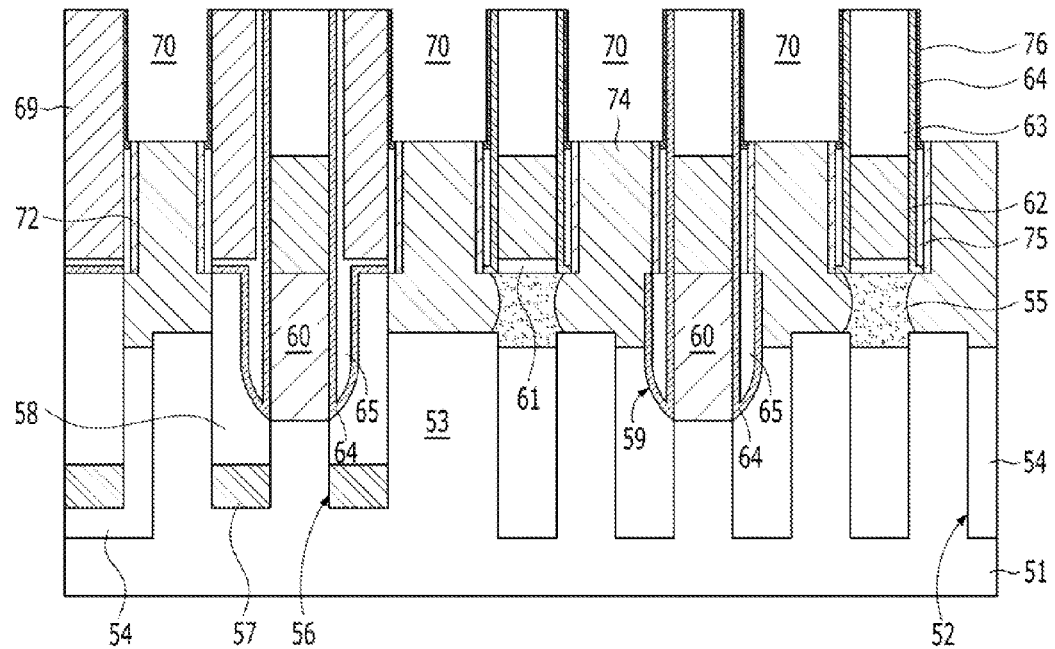
Figure 11M:
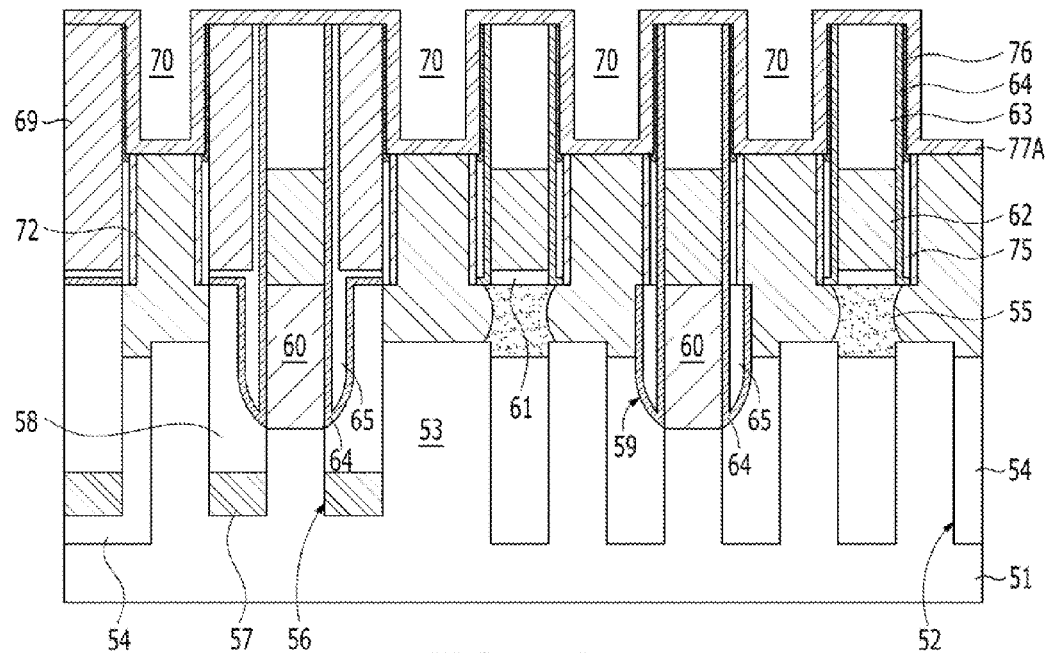
Figure 11N:
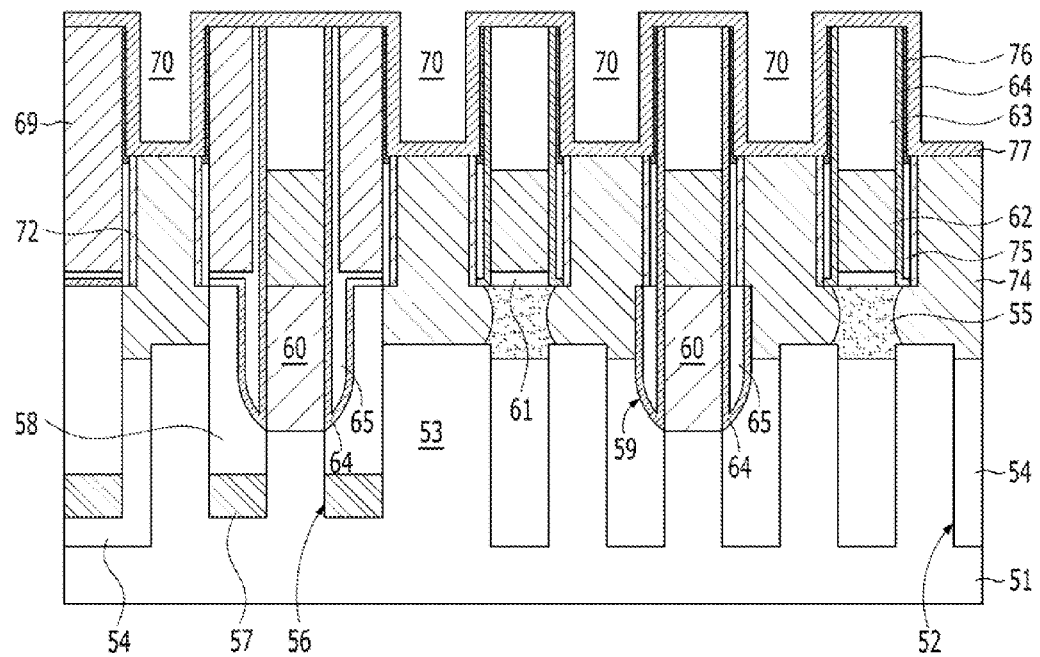
Figure 11O:
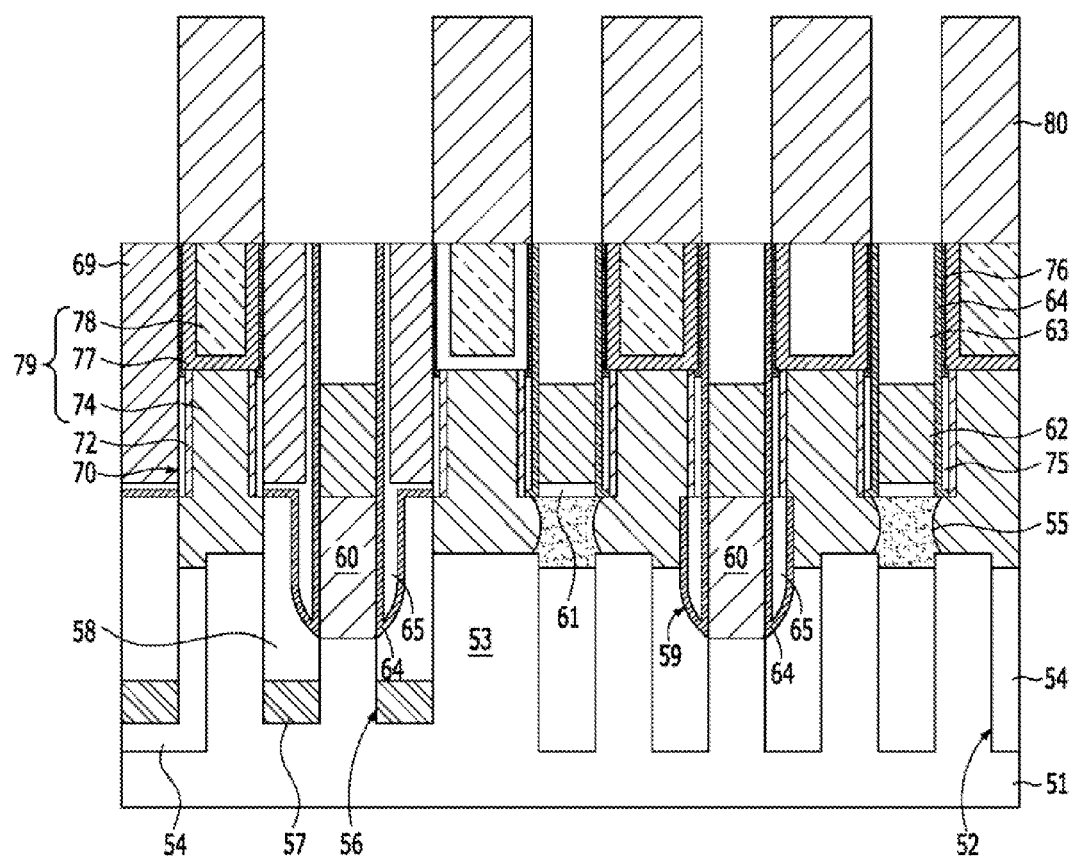

FIGS. 11A to 11O are views showing an exemplary method of fabricating memory cells. FIGS. 11A to 11O are cross-sectional views taken along the line B-B' of FIG. 10B.

Referring to FIG. 11A, an isolation region 54 may be formed in a substrate 51. The substrate 51 may include a silicon substrate, a silicon-germanium substrate or an SOI substrate. The substrate 51 may include a memory cell region and a non-memory cell region. The non-memory cell region may include a peripheral circuit region. Transistors and so forth may be formed in the peripheral circuit region. The isolation region 54 may be formed by an STI (shallow trench isolation) process. The isolation region 54 may be formed in isolation trenches 52. Active regions 53 may be defined by the isolation region 54. Each of the active regions 53 may have an island shape that has a minor axis and a major axis. A plurality of active regions 53 may be isolated by the isolation region 54. The isolation region 54 includes a stack layer having a wall oxide, a liner and a fill substance. The liner may include a silicon nitride or a silicon oxide. The silicon nitride may include $Si_3N_4$, and the silicon oxide may include $SiO_2$. The fill substance may include a silicon oxide such as a spin-on-dielectric (SOD). Further, the fill substance may include a silicon nitride. The silicon nitride may be filled over a silicon nitride liner.

Transistors including buried gate electrodes 57 may be formed. The buried gate electrodes 57 may be buried in the substrate 51. The buried gate electrodes 57 may be formed in gate trenches 56. The gate trenches 56 may be defined through etching of the substrate 51. Etching of the substrate 51 may use a first dielectric layer 55 as an etch mask. The gate trenches 56 may be defined by etching the active regions 53 and the isolation region 54. The depth of the gate trenches 56 may be shallower than the isolation region 54. A gate dielectric layer (not shown) may be formed on the surfaces of the gate trenches 56. The gate dielectric layer may be formed through thermal oxidation. The buried gate electrodes 57 may be formed on the gate dielectric layer, by being recessed. A sealing layer 58 is formed on the buried gate electrodes 57. The buried gate electrodes 57 may be formed by forming a metal-containing layer to fill the gate trenches 56 and then etching back the metal-containing layer. The metal-containing layer may include a substance of which main constituent is a metal such as titanium, tantalum, or tungsten. The metal-containing layer may include at least of a tantalum nitride (TaN), a titanium nitride (TiN), a tungsten nitride (WN), or tungsten (W). For example, the buried gate electrodes 57 may include only a titanium nitride, a tantalum nitride or tungsten. Alternatively, the buried gate electrodes 57 may include a double-layered structure, such as TiN/W or TaN/W, in which tungsten (W) is stacked on a titanium nitride (TiN) or a tantalum nitride (TaN). Further, the buried gate electrodes 57 may include a double-layered structure, such as WN/W, in which tungsten (W) is stacked on a tungsten nitride (WN). Moreover, the buried gate electrodes 57 may include a tungsten layer. Alternatively, the buried gate electrodes 57 may include a metallic substance with low resistance. The sealing layer 58 may fill the gate trenches 56 on the buried gate electrodes 57. The sealing layer 58 protects the buried gate electrodes 57 during a subsequent process. The sealing layer 58 may include a dielectric substance. The sealing layer 58 may include a silicon nitride. After forming the sealing layer 58, source regions and drain regions (not shown) may be formed in the active regions 53. Due to this fact, buried gate type transistors including the buried gate electrodes 57 may be formed.

Next, a second dielectric layer 61 may be formed. By etching the second dielectric layer 61 and the first dielectric layer 55, bit line contact holes 59 may be defined. The bit line contact holes 59 expose portions of the active regions 53. The bit line contact holes 59 may have a shape that exposes the center portions of the active regions 53. Each of the bit line contact holes 59 may have a diameter that is larger than the width of each of the active regions 53 in the minor axis direction. Accordingly, in an etching process for defining the bit line contact holes 59, portions of the isolation region 54 may be etched as well. The portions of the active regions 53, which may be exposed by the bit line contact holes 59, may include any one regions of the source regions and the drain regions of the buried gate type transistors.

The portions of the active regions 53 exposed by the bit line contact holes 59 may be recessed. According to this fact, the height of the surfaces of the active regions 53 to which bit line contact plugs may be to be connected becomes lower than the surfaces of the active regions 53 to which storage node contact plugs may be to be connected.

Then, bit line structures including bit line contact plugs 60, bit lines 62 and bit line hard masks 63 may be formed. The bit line structures may be simultaneously formed through masking and etching.

A method of forming the bit line structures is as follows.

First, the bit line contact plugs 60 may be formed to fill the bit line contact holes 59. The bit line contact plugs 60 may include a polysilicon layer. After the bit line contact holes 59 are filled by the polysilicon layer, the polysilicon layer may be planarized so that the surface of the second dielectric layer 61 is exposed.

Then, a metal-containing layer and a hard mask layer (not shown) may be stacked on the entire surface including the bit line contact plugs 60. Thereafter, the hard mask layer, the metal-containing layer and the bit line contact plugs 60 may be sequentially etched. According to this fact, the bit line structures may be formed. The metal-containing layer becomes the bit lines 62, and the hard mask layer becomes the bit line hard masks 63.

The bit line contact plugs 60 may be formed in the recessed active regions 53. The bit line contact plugs 60 may be formed in the bit line contact holes 59. The bit line contact plugs 60 may have a line width smaller than the diameter of the bit line contact holes 59.

The bit lines 62 may include a tungsten-containing substance. The bit lines 62 may include a tungsten layer.

The bit line hard masks 63 perform the function of protecting the bit lines 62. The bit line hard masks 63 may include a dielectric substance. The bit line hard masks 63 may include a silicon nitride.

As the bit line contact plugs 60 are formed as described above, portions of the bit line contact holes 59 may be opened. This is because the bit line contact plugs 60 may be etched less than the diameter of the bit line contact holes 59.

While not shown, when forming the bit line structures, gate structures may be formed in the non-memory cell region of the substrate 51.

Referring to FIG. 11B, a first spacer layer 64A may be formed on the bit line structures. The first spacer layer 64A may be conformally formed to cover the sidewalls of the bit line contact plugs 60 and the bit lines 62. The first spacer layer 64A may include a dielectric substance. The first spacer layer 64A may include a silicon nitride.

A contact spacer layer 65A may be formed on the first spacer layer 64A. The contact spacer layer 65A may be formed on the entire surface of the substrate 51, including the first spacer layer 64A. The contact spacer layer 65A may include a dielectric substance. The contact spacer layer 65A may include a silicon nitride. The contact spacer layer 65A may be formed while filling the bit line contact holes 59 around the bit line contact plugs 60. By this fact, the bit line contact plugs 60 may be isolated from neighboring structures.

Referring to FIG. 11C, a sacrificial layer 66A may be formed on the contact spacer layer 65A. The sacrificial layer 66A may include an oxide. The sacrificial layer 66A fills the spaces between the bit line structures on the contact spacer layer 65A. The sacrificial layer 66A may be planarized until the contact spacer layer 65A on the bit line structures is exposed. The sacrificial layer 66A may include an SOD or BPSG (boron phosphorus silicate glass). The sacrificial layer 66A may be subsequently baked through annealing.

Contact masks 67 may be formed. The contact masks 67 may be formed by patterning a photoresist layer. The contact masks 67 may be line and space type patterns. The lines of the contact masks 67 cover portions where storage node contact holes may be to be defined. The spaces of the contact masks 67 open portions where an isolation layer is to be formed between the storage node contact holes.

Referring to FIG. 11D, pre-isolation parts 68 may be defined. The pre-isolation parts 68 may be defined through an etching process using the contact masks 67 as etch barriers. The pre-isolation parts 68 may be defined through etching of the sacrificial layer 66A. The contact masks 67 and the bit line structures serve as etch barriers. According to this fact, the sacrificial layer 66A is etched in a manner self-aligned with the mesh type structures that may be formed by crossing of the contact masks 67 and the bit line structures. The etching process for defining the pre-isolation parts 68 is stopped at the contact spacer layer 65A. The sacrificial layer 66A remaining after defining the pre-isolation parts 68 becomes sacrificial patterns 66.

The contact masks 67 may be removed.

Referring to FIG. 11E, an isolation layer 69 may be formed. The isolation layer 69 fills the pre-isolation parts 68. The isolation layer 69 may include a dielectric substance. The isolation layer 69 may include a silicon nitride. The isolation layer 69 and the sacrificial patterns 66 may be formed between the bit line structures.

Next, the sacrificial patterns 66 may be removed. According to this fact, storage node contact holes 70 may be defined. In order to remove the sacrificial patterns 66, wet etching may be applied. The wet etching may include a dip-out process. When performing the wet etching, the bit line structures and underlying structures may be not attacked due to the presence of the contact spacer layer 65A.

As the sacrificial patterns 66 may be removed in this way, the storage node contact holes 70 may be defined. The storage node contact holes 70 may be separated from one another by the patterns of the isolation layer 69. The isolation layer 69 including the storage node contact holes 70 is formed between adjoining bit line structures.

Referring to FIG. 11F, the contact spacer layer 65A may be selectively removed from the bottoms of the storage node contact holes 70. Accordingly, the contact spacer layer 65A on the bit line structures, exposed by the storage node contact holes 70, may be removed too. Contact spacers 65 may be left in the bit line contact holes 59. When removing the contact spacer layer 65A, the first spacer layer 64A may be selectively removed as well. Therefore, first spacers 64 may be formed. The first spacers 64 may be formed on the sidewalls of the bit line structures including the bit line contact plugs 60. The first spacer layer 64A is selectively removed from the tops of the bit line structures. The first spacer layer 64A may be removed from the surface portions of the first dielectric layer 55.

The first spacers 64 and the contact spacers 65 may remain in the bit line contact holes 59.

Referring to FIG. 11G, a sacrificial spacer layer 71A may be formed. The sacrificial spacer layer 71A may include a dielectric substance. The sacrificial spacer layer 71A may include a silicon oxide. The sacrificial spacer layer 71A is formed on the entire structure while covering the sidewalls and the bottoms of the storage node contact holes 70. The sacrificial spacer layer 71A may include a ULTO.

Referring to FIG. 11H, sacrificial spacers 71 may be formed. The sacrificial spacers 71 may be formed through etching of the sacrificial spacer layer 71A. The sacrificial spacer layer 71A may be etched through etch-back. The sacrificial spacers 71 remain on the sidewalls of the storage node contact holes 70.

Then, a second spacer layer 72A may be formed on the entire surface, including the sacrificial spacers 71. The second spacer layer 72A may include a silicon nitride.

Referring to FIG. 11I, second spacers 72 may be formed. The second spacers 72 may be formed through etching of the second spacer layer 72A. The second spacer layer 72A may be etched through etch-back. The second spacers 72 may be formed on the sidewalls of the sacrificial spacers 71.

The first dielectric layer 55 may be etched in a manner self-aligned with the second spacers 72. That is, the first dielectric layer 55 may be etched using the second spacers 72 as a hard mask. According to this fact, the surfaces of the active regions 53 may be exposed on the bottoms of the storage node contact holes 70.

Referring to FIG. 11J, the storage node contact holes 70 may be enlarged (see the reference numeral 73). In order to enlarge the storage node contact holes 70, isotropic etching may be performed. As the isotropic etching, wet etching may be used. By the isotropic etching, the first dielectric layer 55 is etched. A chemical capable of selectively etching the first dielectric layer 55 is used. Since the first dielectric layer 55 may include a silicon oxide, a hydrofluoric acid-based chemical may be used. Since the sealing layer 58 may include a silicon nitride, it is not etched. By enlarging the bottoms of the storage node contact holes 70 in this way, the contact may be a between storage node contact plugs and the active regions 53 is increased.

Referring to FIG. 11K, first plugs 74 may be formed in the storage node contact holes 70. Each of the first plugs 74 has a shape that partially fills the storage node contact hole 70. In other words, the first plugs 74 may be formed to be recessed in the storage node contact holes 70. After forming a conductive layer (not shown) on the entire surface to fill the storage node contact holes 70, by recessing the conductive layer, the first plugs 74 may be formed. The recessed surfaces of the first plugs 74 may be controlled to be at least higher than the top surfaces of the bit lines 62. The first plugs 74 may have a height that minimizes the facing may be a between the first plugs 74 and the bit lines 62. By this fact, the parasitic capacitance between the bit lines 62 and the first plugs 74 may be reduced. The first plugs 74 include a silicon-containing layer. The first plugs 74 may include a polysilicon layer. The first plugs 74 may include a doped polysilicon layer doped with impurities. The first plugs 74 become silicon plugs.

Air gaps 75 may be defined. As the sacrificial spacers 71 between the first spacers 64 and the second spacers 72 may be removed, the air gaps 75 may be defined. The sacrificial spacers 71 may be removed through wet etching. The sacrificial spacers 71 may be removed through a dip-out process. Before wet-etching the sacrificial spacers 71, the height of the second spacers 72 may be lowered. This may be applied in the process of forming the first plugs 74.

The air gaps 75 may be defined between the first spacers 64 and the second spacers 72. Thus, the air gaps 75 may be defined between the bit lines 62 and the first plugs 74. Isolation structures formed by the first spacers 64, the air gaps 75 and the second spacers 72 may be formed between the bit lines 62 and the first plugs 74. The first spacers 64, the air gaps 75 and the second spacers 72 may be NAN (nitride-air-nitride) structures. The air gaps 75 and the second spacers 72 have shapes that surround the sidewalls of the first plugs 74. Isolation structures including the second spacers 72 and the air gaps 74 may be formed between the isolation layer 69 and the first plugs 74.

Referring to FIG. 11L, capping patterns 76 may be formed. The capping patterns 76 cap the air gaps 75. The capping patterns 76 include a silicon oxide. The capping patterns 76 may include a silicon oxide that is formed by plasma oxidation. The capping patterns 76 cap the air gaps 75 while exposing the surfaces of the first plugs 74.

Referring to FIG. 11M, a liner polysilicon layer 77A may be formed on the entire surface including the capping patterns 76. The influence of voids likely to be present in the first plugs 74 is suppressed by the liner polysilicon layer 77A. The liner polysilicon layer 77A may be formed to a thickness of about 40 Å to about 100 Å. It is necessary for the liner polysilicon layer 77A to be uniformly deposited on the surfaces of the first plugs 74 and the surrounding structures. To this end, a seed layer, such as disilane, may be first deposited to improve roughness.

Referring to FIG. 11N, an ohmic contact layer 77 may be formed. The ohmic contact layer 77 may be formed through silicidation of the liner polysilicon layer 77A. For a silicidation process, reference may be made to the first exemplary implementation and the second exemplary implementation. The ohmic contact layer 77 covers the top surfaces of the first plugs 74 and the capping patterns 76. The capping patterns 76 and the air gaps 75 may be protected from cleaning processes that accompany a series of silicidation processes for forming the ohmic contact layer 77. Accordingly, the capping efficiency of the air gaps 75 may be increased. Further, the ohmic contact layer 77 may be uniformly formed by the liner polysilicon layer 77A.

Referring to FIG. 11O, second plugs 78 are formed on the ohmic contact layer 77.

In this way, the ohmic contact layer 77 and the second plugs 78 may be formed on the first plugs 74. Accordingly, storage node contact plugs 79, formed in the storage node contact holes 70, may include the first plugs 74, the ohmic contact layer 77, and the second plugs 78. The ohmic contact layer 77 forms ohmic contacts between the first plugs 74 and the second plugs 78. The air gaps 75 may be defined between the first plugs 74 and the sidewalls of the storage node contact holes 70. Isolation structures, including the air gaps 75, may be formed between the storage node contact plugs 79 and the bit line structures. The air gaps 75 may be capped by the capping patterns 76 and the ohmic contact layer 77. The first plugs 74 may become silicon plugs, and the second plugs 78 may become metal plugs. The storage node contact plugs 79 become semi-metal plugs (SMPs).

In another exemplary implementation, the air gaps 74 may be capped by using only the ohmic contact layer 77 without the capping patterns 76.

Memory elements may be formed on the storage node contact plugs 79. The memory elements include capacitors that include storage nodes 80. While not shown, a dielectric layer and plate nodes may be formed on the storage nodes 80. The storage nodes 80 have a pillar shape and may have a cylinder shape in another exemplary implementation.

According to the present exemplary implementation, as the air gaps 75 may be defined between the storage node contact plugs 79 and the bit lines 62, parasitic capacitance may be reduced. Since parasitic capacitance is reduced, a sensing margin may be increased.

Also, by the method of forming the liner polysilicon layer 77A, the loss of the capping patterns 76 may be substantially prevented and the influence by the voids generated in the first plugs 74 may be suppressed. Further, because the ohmic contact layer 77 is formed through silicidation of the liner polysilicon layer 77A, the ohmic contact layer 77 may be uniformly formed without adverse influence by the voids.

As a result, the contact resistance between the first plugs 74 and the second plugs 78 may be reduced, and accordingly, a tWR (write recovery time) may be improved and the operation speed of the memory cells may be improved.

Figure 12:
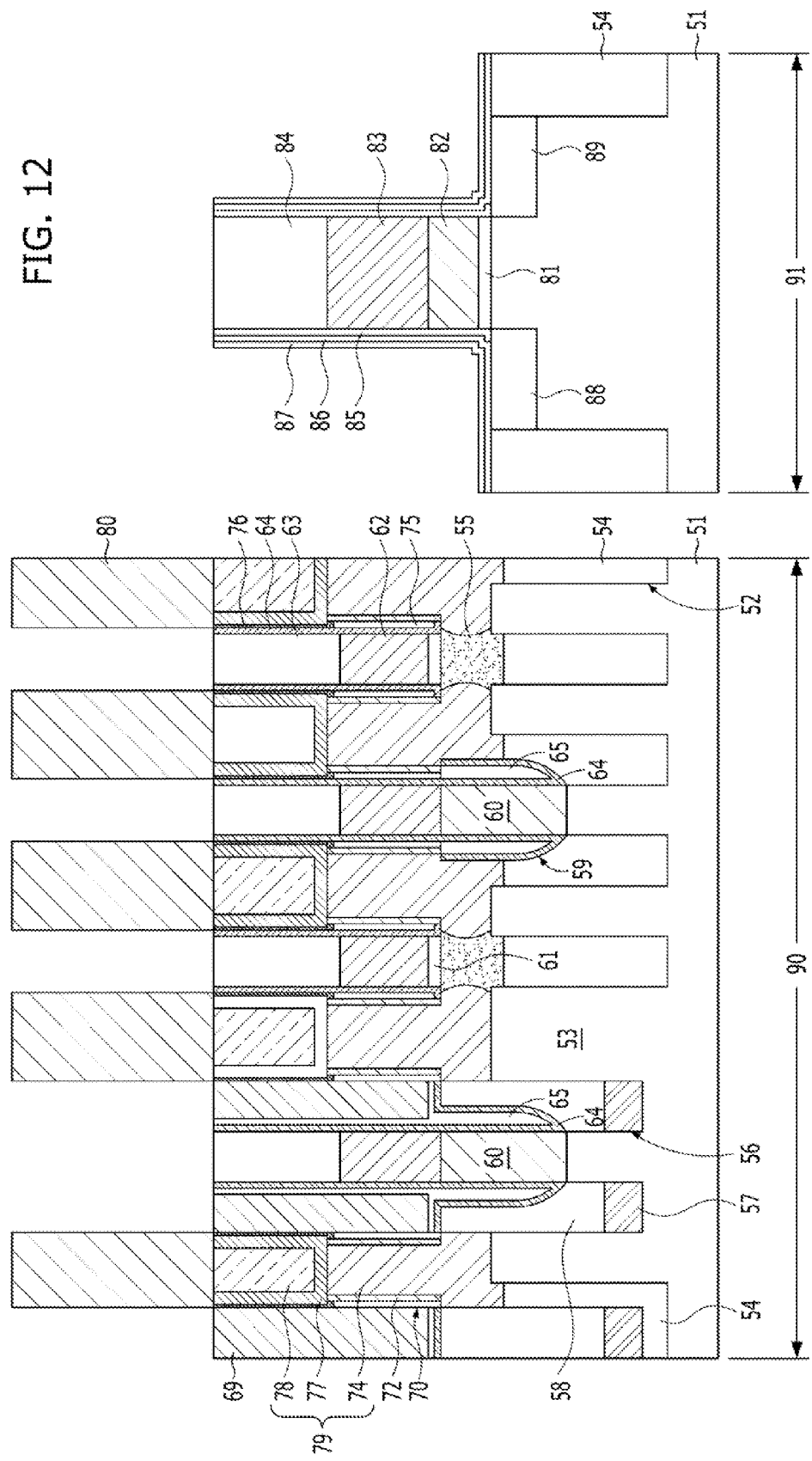
FIG. 12 is a view illustrating a memory device including memory cells.

FIG. 12 is a view illustrating a memory device including memory cells.

Referring to FIG. 12, the substrate 51 may include a memory cell region 90 and a non-memory cell region 91. The memory cells shown in FIG. 11O may be formed in the memory cell region 90. Transistors including gate structures may be formed in the non-memory cell region 91. The transistors may include planar gate type transistors. The planar gate type transistors include gate structures, source regions 88, and drain regions 89.

Each of the gate structures may include a gate dielectric layer 81, a gate electrode, and a gate hard mask 84. The gate electrode and the gate hard mask 84 may be simultaneously formed when forming the bit line structures of the memory cells. As the gate electrode, a first gate electrode 82 and a second gate electrode 83 may be stacked. The second gate electrode 83 and the gate hard mask 84 may be the same as the bit line 62 and the bit line hard mask 63. The first gate electrode 82 is the same as the bit line contact plug 60 or may be formed through an additional process.

Spacer structures may be formed on the sidewalls of the gate structures. The spacer structures may include first gate spacers 85, second gate spacers 86, and third gate spacers 87. The first gate spacers 85 may be the same as the first spacers 64, and the third gate spacers 87 may be the same as contact spacers 65. The second gate spacers 86 may be selectively formed only in the non-memory cell region 91 before forming the contact spacers 65. The first gate spacers 85 and the third gate spacers 87 include a silicon nitride, and the second gate spacers 86 include a silicon oxide.

According to FIG. 12, parasitic capacitance is reduced by defining the air gaps 75 between the storage node contact plugs 79 and the bit lines 62. Since parasitic capacitance is reduced, the sensing margin of the memory device may be improved. By the method of forming the liner polysilicon layer 77A, the loss of the capping patterns 76 may be substantially prevented and the influence by the voids generated in the first plugs 74 may be suppressed. Further, because the ohmic contact layer 77 is formed through silicidation of the liner polysilicon layer 77A, the ohmic contact layer 77 may be uniformly formed without adverse influence by the voids.

As a result, the contact resistance between the first plugs 74 and the second plugs 78 may be reduced, and accordingly, a tWR may be improved and the operation speed of the memory cells may be improved.

In another exemplary implementation, trench gate type transistors, buried gate type transistors, recess gate type transistors or vertical channel transistors may be formed in the non-memory cell region 91.

The semiconductor devices according to the above-described exemplary implementations may be applied to a DRAM (dynamic random access memory), without a limiting sense, and may also be limited to a memory, such as an SRAM (static random access memory), a flash memory, an FeRAM (ferroelectric random access memory), an MRAM (magnetic random access memory), or a PRAM (phase change random access memory).

Figure 13:
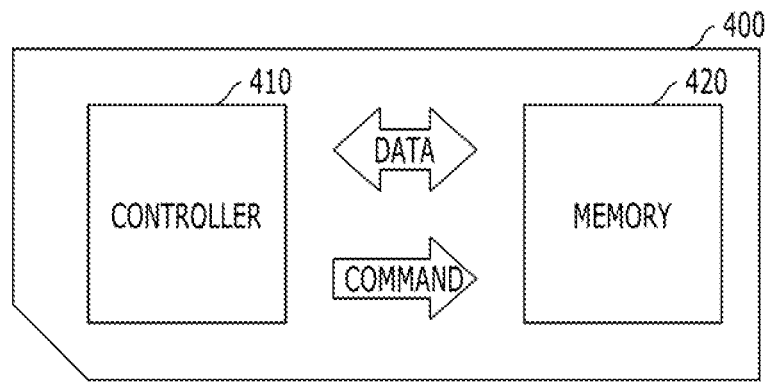
FIG. 13 is a schematic diagram showing a memory card.

FIG. 13 is a schematic diagram showing a memory card.

Referring to FIG. 13, a memory card 400 may include a controller 410 and a memory 420. The controller 410 and the memory 420 may exchange electric signals. For example, the memory 420 and the controller 410 may exchange data according to a command from the controller 410. According to this fact, the memory card 400 may store data in the memory 420 or output data from the memory 420 to an outside. The memory 420 may include the semiconductor device with air gaps described above. Accordingly, the high speed operation of the memory card 400 is possible. The memory card 400 may be used as data storage media of various portable appliances. For example, the memory card 400 may include a memory stick card, a smart media card (SM), a secure digital (SD), a mini secure digital card (mini SD), or a multimedia card (MMC).

Figure 14:
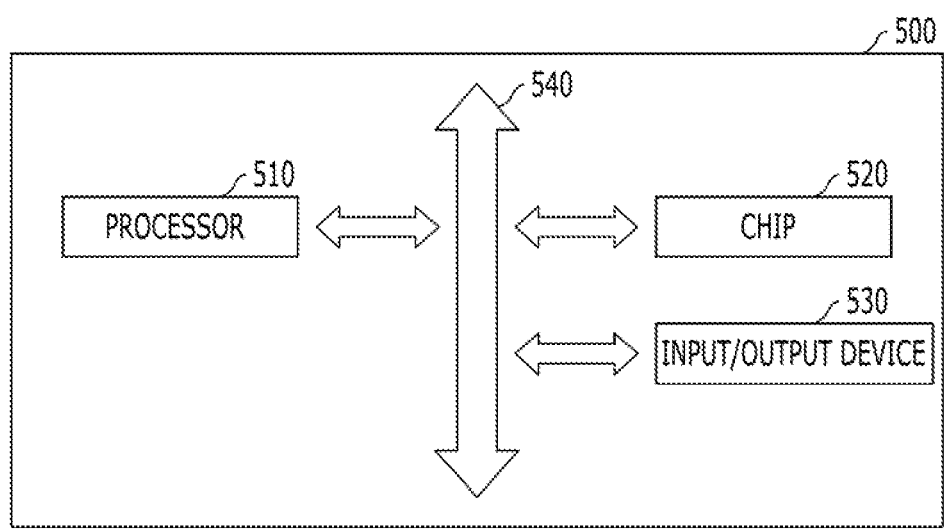
FIG. 14 is a block diagram showing an electronic system.

FIG. 14 is a block diagram showing an electronic system.

Referring to FIG. 14, an electronic system 500 may include a processor 510, an input/output device 530, and a chip 520 which may implement data communication by using a bus 540. The processor 510 may play a role of executing a program and controlling the electronic system 500. The input/output device 530 may be used in inputting and outputting data to and from the electronic system. The electronic system 500 may be connected with an external device, for example, a personal computer or a network, by using the input/output device 530, and may exchange data with the external device. The chip 520 may store codes and data for operations of the processor 510 and may perform some operations ordered from the processor 510. For example, the chip 520 may include the semiconductor device with air gaps described above, memory cells, and a memory device. Accordingly, the performance of the electronic system 500 may be improved. The electronic system 500 may include various electronic control apparatuses that use the chip 520. Such electronic control apparatuses may include, for example, a mobile phone, an MP3 player, a navigator, a solid state disk (SSD), a household appliance, etc.

Although various exemplary implementations have been described for illustrative purposes, it will be apparent to those skilled in the art that various changes and modifications may be made without departing from the spirit and scope of the invention as defined in the following claims.

What is claimed is:

1. A semiconductor device, including isolation structures having openings exposing surface portions of a substrate, and conductive structures formed in the openings, the conductive structures comprising:
   recessed first conductive patterns formed in the openings;
   air gaps defined between sidewalls of the openings and the recessed first conductive patterns;
   capping patterns to cap the air gaps;
   second conductive patterns formed over top surfaces of the first conductive patterns and the capping patterns and on upper sidewalls of the openings, the second conductive patterns including a metal silicide; and
   third conductive patterns formed over the second conductive patterns.

2. The semiconductor device according to claim 1, wherein the conductive structures comprise plugs.

3. The semiconductor device according to claim 1, wherein the metal silicide comprises a silicide of a polysilicon layer.

4. The semiconductor device according to claim 1, wherein the first conductive patterns comprise a polysilicon layer, and the third conductive patterns comprise a metal layer.

5. The semiconductor device according to claim 1, wherein the isolation structures comprise a silicon nitride.

6. A semiconductor device comprising:
   a plurality of conductive structures formed over a substrate, the plurality of conductive structures including conductive patterns;
   protective spacers formed on sidewalls of the plurality of conductive structures;
   isolation structures formed between the plurality of conductive structures, the isolation structures including a plurality of openings;
   recessed first conductive patterns formed in the openings;
   air gaps defined between the conductive patterns and the recessed first conductive patterns;
   capping patterns to cap the air gaps;
   second conductive patterns formed over top surfaces of the first conductive patterns, the capping patterns, and on upper sidewalls of the openings, the second conductive patterns including a metal silicide; and
   third conductive patterns formed over the second conductive patterns.

7. The semiconductor device according to claim 6, wherein the metal silicide comprises a silicide of a polysilicon layer.

8. The semiconductor device according to claim 6, wherein the first conductive patterns comprise a polysilicon layer, and the third conductive patterns comprise a metal layer.

9. The semiconductor device according to claim 6, wherein the isolation structures and the protective spacers comprise a silicon nitride.

10. The semiconductor device according to claim 6, wherein stack structures of the first conductive patterns, the second conductive patterns and the third conductive patterns become plugs.

11. The semiconductor device according to claim 6, further comprising:
    gate type transistors buried in the substrate,
    wherein the first conductive patterns are to be connected to source regions or drain regions of the gate type transistors.

12. A memory device comprising:
    a substrate;
    gate type transistors buried in the substrate;
    a plurality of bit line structures, formed over the substrate, to be connected to the buried gate type transistors;
    isolation structures including a plurality of openings defined between the plurality of bit line structures;
    silicon plugs formed in the openings;
    air gaps defined between the silicon plugs and the plurality of bit line structures;
    capping patterns to cap the air gaps;
    an ohmic contact layer covering the silicon plugs, the capping patterns, and sidewalls of the plurality of bit line structures, the ohmic contact layer including a metal silicide;
    metal plugs formed over the ohmic contact layer; and
    memory elements formed over the metal plugs.

13. The memory device according to claim 12, wherein the metal silicide comprises a silicide of a polysilicon layer.

14. The memory device according to claim 12, further comprising:
    protective spacers formed on the sidewalls of the plurality of bit line structures; and
    spacers surrounding sidewalls of the silicon plugs,
    wherein the air gaps are defined between the protective spacers and the spacers.

15. The memory device according to claim 14, wherein the protective spacers and the spacers comprise a silicon nitride.

16. The memory device according to claim 12, wherein bottom portions of the openings are enlarged sideward.

17. The memory device according to claim 12, further comprising:
    a dielectric layer formed between the plurality of bit line structures and the substrate, the dielectric layer including contact holes to expose a surface of the substrate;
    bit line contact plugs formed in the contact holes, the bit line contact plugs having a width smaller than a diameter of the contact holes; and
    contact spacers formed around the bit line contact plugs.

18. The memory device according to claim 17, wherein the bit line structures and the bit line contact plugs have a same width.

19. The memory device according to claim 14, wherein the spacers extend to cover the sidewalls of the plurality of bit line structures.

20. The memory device according to claim 12, further comprising:

planar gate type transistors formed in a non-memory cell region of the substrate.

\* \* \* \* \*